United States Patent
Strohmann et al.

(10) Patent No.: US 11,798,308 B2
(45) Date of Patent: Oct. 24, 2023

(54) APPARATUS WITH ULTRASONIC FINGERPRINT SENSOR AND ONE OR MORE RESONATORS, AND RELATED SYSTEMS AND METHODS

(71) Applicant: QUALCOMM Incorporated, San Diego, CA (US)

(72) Inventors: Jessica Liu Strohmann, Cupertino, CA (US); Hrishikesh Vijaykumar Panchawagh, Cupertino, CA (US); Nai-Kuei Kuo, Los Gatos, CA (US); Yipeng Lu, Davis, CA (US); Ali Lopez, Dublin, CA (US); Kostadin Dimitrov Djordjev, Los Gatos, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 17/448,037

(22) Filed: Sep. 17, 2021

(65) Prior Publication Data
US 2023/0086418 A1 Mar. 23, 2023

(51) Int. Cl.
*G01N 29/09* (2006.01)
*G06V 40/13* (2022.01)
(Continued)

(52) U.S. Cl.
CPC ........ *G06V 40/1306* (2022.01); *B06B 1/0688* (2013.01); *H10K 59/65* (2023.02); *B06B 2201/70* (2013.01)

(58) Field of Classification Search
CPC .............. G06V 40/1306; B06B 1/0688; B06B 2201/70; H01L 27/3234
(Continued)

(56) References Cited

U.S. PATENT DOCUMENTS

| | | | |
|---|---|---|---|
| 11,436,857 B1 | 9/2022 | Strohmann | |
| 2015/0241393 A1* | 8/2015 | Ganti | G06V 40/1306 73/589 |

(Continued)

FOREIGN PATENT DOCUMENTS

CN 110427822 A 11/2019

OTHER PUBLICATIONS

International Search Report and Written Opinion—PCT/US2022/074552—ISA/EPO—dated Nov. 10, 2022.

*Primary Examiner* — Abdul-Samad A Adediran
(74) *Attorney, Agent, or Firm* — QUALCOMM Incorporated

(57) ABSTRACT

Some disclosed implementations include an ultrasonic sensor stack and an acoustic resonator. The acoustic resonator may be configured to enhance ultrasonic waves transmitted by the ultrasonic sensor stack in an ultrasonic frequency range that is suitable for ultrasonic fingerprint sensors. In some examples, the acoustic resonator may include one or more low-impedance layers residing between a first higher-impedance layer and a second higher-impedance layer. Each of the one or more low-impedance layers may have a lower acoustic impedance than an acoustic impedance of the first higher-impedance layer or an acoustic impedance of the second higher-impedance layer. At least one low-impedance layer may have a thickness corresponding to a multiple of a half wavelength at a peak frequency of the acoustic resonator. The peak frequency may be within a frequency range from 1 MHz. to 20 MHz.

24 Claims, 12 Drawing Sheets

(51) Int. Cl.
*H10K 59/65* (2023.01)
*B06B 1/06* (2006.01)

(58) Field of Classification Search
USPC .......................................................... 73/589
See application file for complete search history.

(56) References Cited

U.S. PATENT DOCUMENTS

| | | |
|---|---|---|
| 2018/0373913 A1 | 12/2018 | Panchawagh et al. |
| 2019/0370518 A1 | 12/2019 | Maor et al. |
| 2020/0410070 A1 | 12/2020 | Strohmann |
| 2021/0004555 A1 | 1/2021 | Panchawagh et al. |
| 2021/0278927 A1 | 9/2021 | Jennings et al. |
| 2021/0397801 A1 | 12/2021 | Arellano et al. |
| 2023/0088820 A1 | 3/2023 | Strohmann et al. |

\* cited by examiner

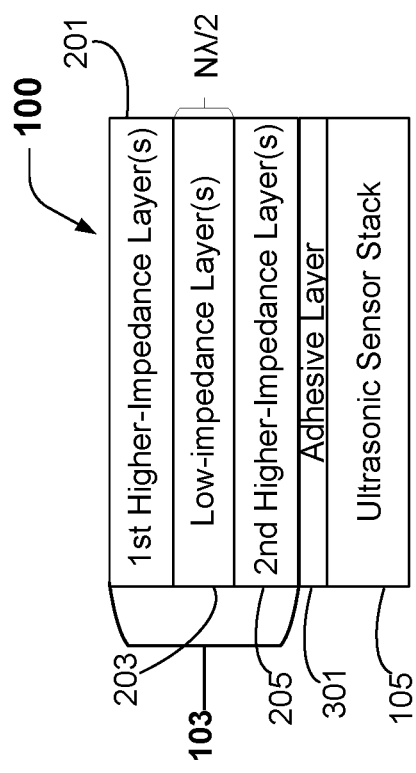
*Figure 3A*
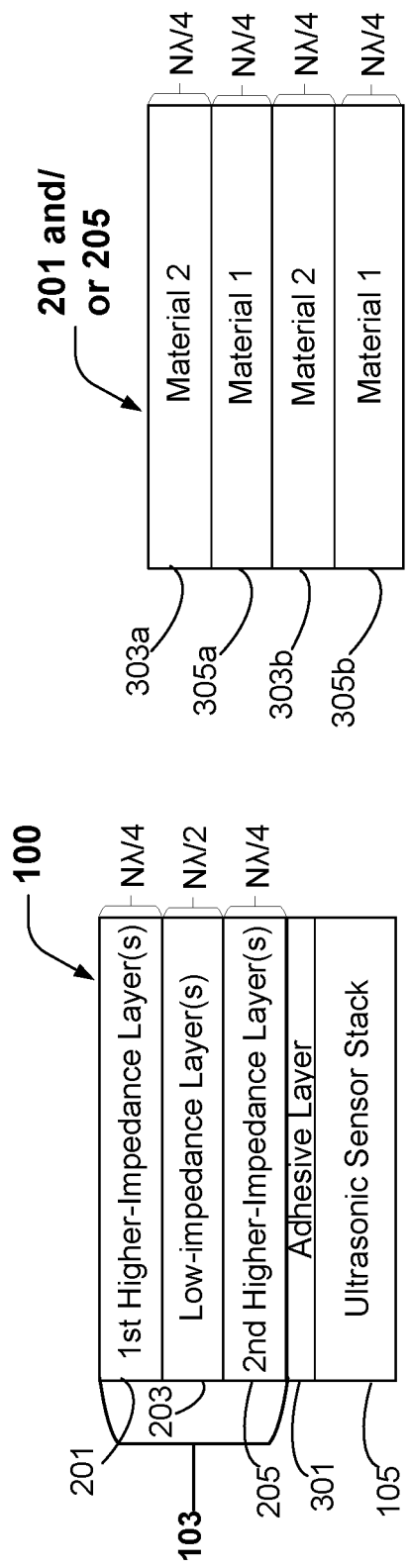
*Figure 3B*
*Figure 3C*

APPARATUS WITH ULTRASONIC FINGERPRINT SENSOR AND ONE OR MORE RESONATORS, AND RELATED SYSTEMS AND METHODS

TECHNICAL FIELD

This disclosure relates generally to ultrasonic sensors and methods for using such sensors.

DESCRIPTION OF THE RELATED TECHNOLOGY

Biometric authentication can be an important feature for controlling access to devices, etc. Many existing products include some type of biometric authentication. Although some existing biometric authentication technologies provide satisfactory performance, improved methods and devices would be desirable.

SUMMARY

The systems, methods and devices of the disclosure each have several innovative aspects, no single one of which is solely responsible for the desirable attributes disclosed herein.

One innovative aspect of the subject matter described in this disclosure may be implemented in an apparatus. The apparatus may include an ultrasonic sensor stack and an acoustic resonator. In some implementations, the acoustic resonator may include one or more higher-impedance layers having a thickness corresponding to a multiple of a half wavelength at a peak frequency of the acoustic resonator. In some implementations, the acoustic resonator may include one or more first low-impedance layers residing between a first side of one or more higher-impedance layers and the ultrasonic sensor stack. In some examples, each layer of the one or more first low-impedance layers may have a lower acoustic impedance than an acoustic impedance of one or more higher-impedance layers. In some examples, each layer of the one or more first low-impedance layers may have a thickness corresponding to a multiple of a quarter wavelength at the peak frequency of the acoustic resonator.

In some implementations, the acoustic resonator may include one or more second low-impedance layers residing proximate a second side of one or more higher-impedance layers. According to some examples, each layer of the one or more second low-impedance layers may have a lower acoustic impedance than the acoustic impedance of one or more higher-impedance layers. In some examples, each layer of the one or more second low-impedance layers may have a thickness corresponding to a multiple of the quarter wavelength at the peak frequency of the acoustic resonator.

According to some examples, one or more of the one or more higher-impedance layers may be, or may include, glass. In some implementations, one or more of the one or more higher-impedance layers may be, or may include, metal.

In some examples, at least one of the one or more first low-impedance layers and/or the one or more second low-impedance layers may include a plurality of layers. In some such examples, the plurality of layers may include at least a first layer and a second layer. In some implementations, the first layer may have a first acoustic impedance that is higher than a second acoustic impedance of the second layer.

In some implementations, the one or more second low-impedance layers may reside between the display stack and the one or more higher-impedance layers.

According to some examples, the apparatus also may include a display stack. In some such examples, the one or more second low-impedance layers may reside between the display stack and the one or more higher-impedance layers.

According to some implementations, the apparatus may be a mobile device that includes the ultrasonic sensor stack and the acoustic resonator.

Other innovative aspects of the subject matter described in this disclosure may be implemented in an apparatus. The apparatus may include an ultrasonic sensor stack and an acoustic resonator. In some implementations, the acoustic resonator may include one or more higher-impedance layers. In some examples, the one or more higher-impedance layers may have a thickness corresponding to a multiple of a half wavelength at a peak frequency of the acoustic resonator.

In some implementations, the acoustic resonator may include one or more first low-impedance layers residing between a first side of one or more higher-impedance layers and the ultrasonic sensor stack. In some examples, each layer of the one or more first low-impedance layers may have a lower acoustic impedance than an acoustic impedance of one or more higher-impedance layers. In some instances, each layer of the one or more first low-impedance layers may have a thickness corresponding to a multiple of a quarter wavelength at the peak frequency of the acoustic resonator.

In some examples, the acoustic resonator may include one or more second low-impedance layers residing proximate a second side of one or more higher-impedance layers. In some instances, each layer of the one or more second low-impedance layers may have a lower acoustic impedance than the acoustic impedance of one or more higher-impedance layers. In some examples, each layer of the one or more second low-impedance layers may have a thickness corresponding to a multiple of the quarter wavelength at the peak frequency of the acoustic resonator.

According to some examples, one or more of the one or more higher-impedance layers may be, or may include, glass. In some implementations, one or more of the one or more higher-impedance layers may be, or may include, metal. In some examples, at least one of the one or more first low-impedance layers and/or the one or more second low-impedance layers may include a plurality of layers. In some such examples, the plurality of layers may include at least a first layer and a second layer. In some such instances, the first layer may have a first acoustic impedance that is higher than a second acoustic impedance of the second layer.

In some implementations, the apparatus also may include a display stack. In some such examples, the one or more second low-impedance layers may reside between the display stack and the one or more higher-impedance layers.

According to some implementations, the apparatus may be a mobile device that includes the ultrasonic sensor stack and the acoustic resonator.

Yet other innovative aspects of the subject matter described in this disclosure may be implemented in an apparatus. The apparatus may include an ultrasonic sensor stack, an acoustic resonator and a display stack residing between the ultrasonic sensor stack and the acoustic resonator. In some implementations, the acoustic resonator may include one or more high-impedance layers having a thickness corresponding to a multiple of a half wavelength at a peak frequency of the acoustic resonator.

In some examples, one or more of one or more high-impedance layers may be, or may include, glass. In some examples, one or more of the one or more higher-impedance layers may be, or may include, metal.

According to some examples, the apparatus may be a mobile device that includes the ultrasonic sensor stack, the display stack and the acoustic resonator.

In some examples, the display stack may be, or may include, an organic light-emitting diode display stack.

Still other innovative aspects of the subject matter described in this disclosure may be implemented in an apparatus. The apparatus may include an ultrasonic sensor stack and an acoustic resonator. In some implementations, the acoustic resonator may include a first higher-impedance layer, a second higher-impedance layer and one or more low-impedance layers residing between the first higher-impedance layer and the second higher-impedance layer. In some examples, each of the one or more low-impedance layers may have a lower acoustic impedance than an acoustic impedance of the first higher-impedance layer or an acoustic impedance of the second higher-impedance layer. In some examples, at least one of the one or more low-impedance layers may have a thickness corresponding to a multiple of a half wavelength at a peak frequency of the acoustic resonator.

According to some examples, at least one of the first higher-impedance layer or the second higher-impedance layer may have a thickness corresponding to a multiple of a quarter wavelength at the peak frequency of the acoustic resonator. In some instances, at least one of the first higher-impedance layer or the second higher-impedance layer may have a thickness corresponding to less than one-eighth of a wavelength at the peak frequency of the acoustic resonator.

In some examples, the ultrasonic sensor stack may reside between the first higher-impedance layer and the second higher-impedance layer. According to some examples, the one or more low-impedance layers may include a first low-impedance layer residing between the ultrasonic sensor stack and the first higher-impedance layer and a second low-impedance layer residing between the ultrasonic sensor stack and the second higher-impedance layer. In some such examples, the first low-impedance layer and the second low-impedance layer may each have a thickness corresponding to a multiple of a half wavelength at the peak frequency.

In some implementations, the one or more low-impedance layers also may include a third low-impedance layer residing between the first low-impedance layer and the first higher-impedance layer, a fourth low-impedance layer residing between the first low-impedance layer and the ultrasonic sensor stack, a fifth low-impedance layer residing between the second low-impedance layer and the ultrasonic sensor stack and a sixth low-impedance layer residing between the second low-impedance layer and the second higher-impedance layer. In some examples, the third low-impedance layer, the fourth low-impedance layer the fifth low-impedance layer and the sixth low-impedance layer may each have a thickness corresponding to a multiple of the half wavelength at the peak frequency. According to some such examples, the third low-impedance layer, the fourth low-impedance layer, the fifth low-impedance layer and the sixth low-impedance layer may each have a lower acoustic impedance than the acoustic impedance of the first low-impedance layer or a lower acoustic impedance than the acoustic impedance of the second low-impedance layer.

In some implementations, the one or more low-impedance layers may include a first low-impedance layer, a second low-impedance layer residing between the first low-impedance layer and the first higher-impedance layer and a third low-impedance layer residing between the first low-impedance layer and the second higher-impedance layer. In some such examples, the second low-impedance layer and the third low-impedance layer may each have an acoustic impedance that is lower than an acoustic impedance of the first low-impedance layer. According to some examples, the first low-impedance layer, the second low-impedance layer and the third low-impedance layer may each have a thickness corresponding to a multiple of the half wavelength at the peak frequency. According to some examples, the first low-impedance layer may have a thickness corresponding to a multiple of the half wavelength at the peak frequency and the second low-impedance layer and the third low-impedance layer may each have a thickness corresponding to a multiple of a quarter wavelength at the peak frequency.

In some examples, at least one of the first higher-impedance layer or the second higher-impedance layer may include glass. According to some examples, at least one of the first higher-impedance layer or the second higher-impedance layer may include metal.

In some implementations, at least one of the first higher-impedance layer or the second higher-impedance layer may include a plurality of layers having a thickness corresponding to a multiple of a quarter wavelength at the peak frequency of the acoustic resonator. In some such implementations, the plurality of layers may include at least a first layer and a second layer, the first layer having a first acoustic impedance that is higher than a second acoustic impedance of the second layer.

According to some examples, the apparatus may be a mobile device that includes the ultrasonic sensor stack and the acoustic resonator.

Other innovative aspects of the subject matter described in this disclosure may be implemented in an apparatus. The apparatus may include an ultrasonic sensor stack and an acoustic resonator. In some implementations, the acoustic resonator may include a first higher-impedance layer, a second higher-impedance layer and one or more low-impedance layers residing between the first higher-impedance layer and the second higher-impedance layer. In some examples, each of the one or more low-impedance layers may have a lower acoustic impedance than an acoustic impedance of the first higher-impedance layer or an acoustic impedance of the second higher-impedance layer. In some instances, at least one of the one or more low-impedance layers may have a thickness corresponding to a multiple of a half wavelength at a peak frequency of the acoustic resonator.

In some examples, at least one of the first higher-impedance layer or the second higher-impedance layer may have a thickness corresponding to a multiple of a quarter wavelength at the peak frequency of the acoustic resonator. In some examples, at least one of the first higher-impedance layer or the second higher-impedance layer may have a thickness corresponding to less than one-eighth of a wavelength at the peak frequency of the acoustic resonator.

In some implementations, the ultrasonic sensor stack may reside between the first higher-impedance layer and the second higher-impedance layer. In some such examples, the one or more low-impedance layers may include a first low-impedance layer residing between the ultrasonic sensor stack and the first higher-impedance layer and a second low-impedance layer residing between the ultrasonic sensor stack and the second higher-impedance layer. In some examples, the first low-impedance layer and the second low-impedance layer may each have a thickness corresponding to a multiple of a half wavelength at the peak frequency.

In some examples, the apparatus may include a control system. The control system may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof.

According to some examples, the control system may be configured to perform some or all of the methods disclosed herein.

Other innovative aspects of the subject matter described in this disclosure may be implemented in a method. In some examples, the method may involve controlling, via a control system, an ultrasonic sensor stack to transmit ultrasonic waves through an acoustic resonator to a target object on an outer surface of an apparatus that includes the ultrasonic sensor stack and the acoustic resonator. Some methods may involve receiving, by the control system and from the ultrasonic sensor stack, ultrasonic sensor signals corresponding to reflections of transmitted ultrasonic waves from the target object. Some methods may involve performing an authentication process based, at least in part, on the ultrasonic sensor signals.

According to some implementations, the acoustic resonator may include one or more higher-impedance layers having a thickness corresponding to a multiple of a half wavelength at a peak frequency of the acoustic resonator. In some implementations, the acoustic resonator may include one or more first low-impedance layers residing between a first side of one or more higher-impedance layers and the ultrasonic sensor means. In some instances, each layer of the one or more first low-impedance layers may have a lower acoustic impedance than an acoustic impedance of one or more higher-impedance layers. In some examples, each layer of the one or more first low-impedance layers may have a thickness corresponding to a multiple of a quarter wavelength at the peak frequency of the acoustic resonator.

In some examples, the acoustic resonator may include one or more second low-impedance layers residing proximate a second side of one or more higher-impedance layers. In some instances, each layer of the one or more second low-impedance layers may have a lower acoustic impedance than the acoustic impedance of one or more higher-impedance layers. In some examples, each layer of the one or more second low-impedance layers may have a thickness corresponding to a multiple of the quarter wavelength at the peak frequency of the acoustic resonator.

In some implementations, one or more of the one or more higher-impedance layers may be, or may include, glass. In some examples, one or more of the one or more higher-impedance layers may be, or may include, metal.

According to some examples, at least one of the one or more first low-impedance layers or the one or more second low-impedance layers may include a plurality of layers. In some such examples, the plurality of layers may include at least a first layer and a second layer. In some instances, the first layer may have a first acoustic impedance that is higher than a second acoustic impedance of the second layer.

In some examples, the apparatus also may include a display stack. In some such examples, the one or more second low-impedance layers may reside between the display stack and the one or more higher-impedance layers.

In some implementations, the apparatus may be a mobile device that includes the ultrasonic sensor means and the acoustic resonator.

Still other innovative aspects of the subject matter described in this disclosure may be implemented in a method. In some examples, the method may involve controlling, via a control system, an ultrasonic transceiver layer of an ultrasonic sensor system to transmit ultrasonic waves through at least a first resonator configured for causing a first local maximum of ultrasonic wave transmission in a first ultrasonic frequency range. Some such methods may involve receiving, by the control system and from the ultrasonic sensor system, ultrasonic sensor signals corresponding to reflections of transmitted ultrasonic waves from a portion of a target object positioned on an outer surface of an apparatus that includes the ultrasonic sensor system. Some such methods may involve performing, by the control system, an authentication process based, at least in part, on the ultrasonic sensor signals.

According to some examples, the first local maximum of ultrasonic wave transmission may correspond to a frequency in a range from 1 MHz to 20 MHz. In some instances, the authentication process may involve extracting target object features from the ultrasonic sensor signals. Some methods may involve controlling access to the apparatus based, at least in part, on the authentication process.

Some or all of the operations, functions and/or methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, some innovative aspects of the subject matter described in this disclosure can be implemented in one or more non-transitory media having software stored thereon. For example, the software may include instructions for controlling one or more devices to perform one or more of the disclosed methods.

BRIEF DESCRIPTION OF THE DRAWINGS

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale. Like reference numbers and designations in the various drawings indicate like elements.

FIG. 3A shows an example cross-section through an apparatus according to some disclosed implementations.

FIG. 3B shows another example cross-section through an apparatus according to some disclosed implementations.

FIG. 3C shows an example cross-section through one of the higher-impedance layers of FIG. 3B according to some disclosed implementations.

DETAILED DESCRIPTION

Figure 1:
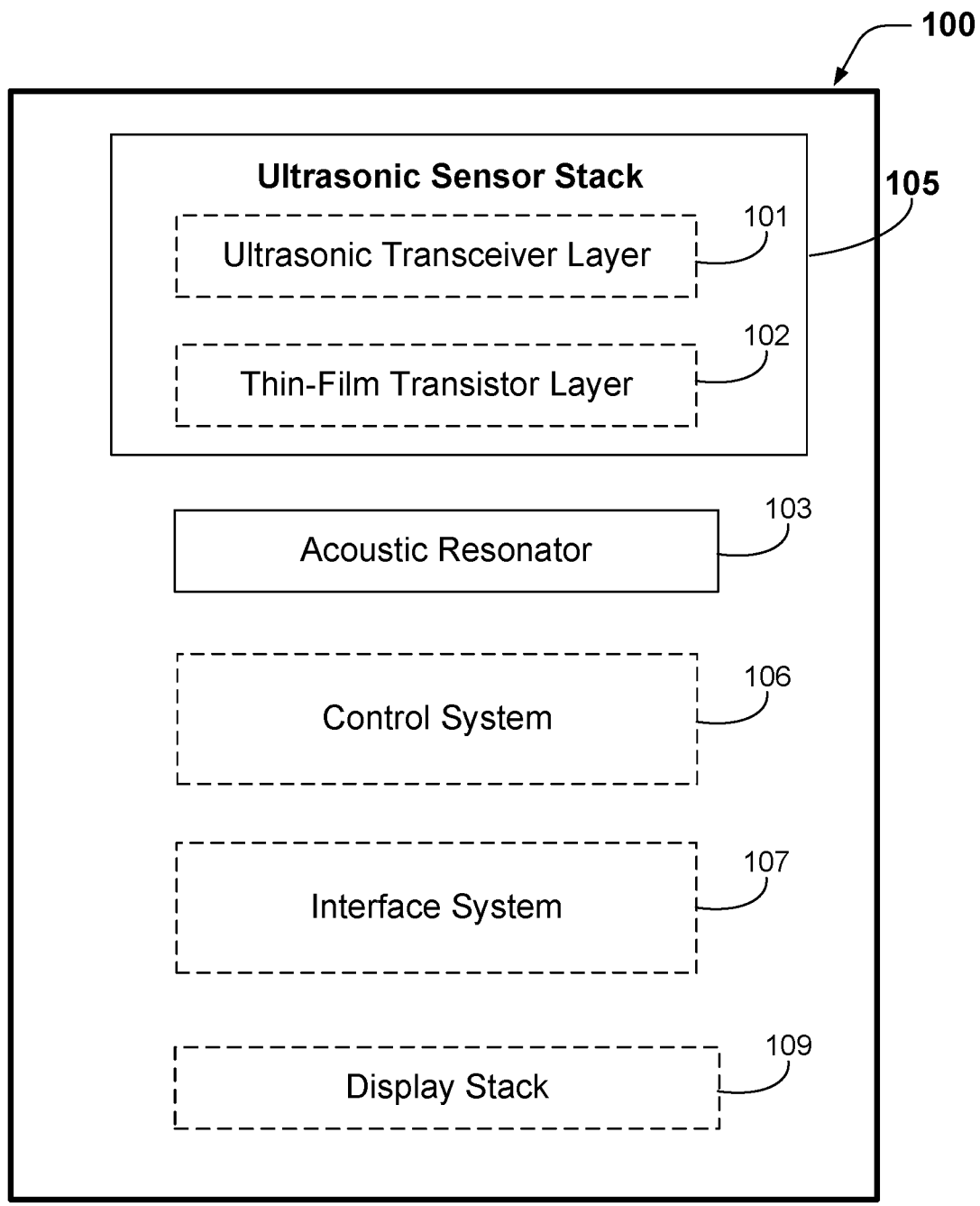
FIG. 1 is a block diagram that shows example components of an apparatus according to some disclosed implementations.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes a biometric system as disclosed herein. In addition, it is contemplated that the described implementations may be included in or associated with a variety of electronic devices such as, but not limited to: mobile telephones, multimedia Internet enabled cellular telephones, mobile television receivers, wireless devices, smartphones, smart cards, wearable devices such as bracelets, armbands, wristbands, rings, headbands, patches, etc., Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, magnetometers, inertial components for consumer electronics, parts of consumer electronics products, steering wheels or other automobile parts, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Incorporating an ultrasonic sensor system into an apparatus, a structure, etc., can present various design challenges. For example, it is challenging to design an under-display ultrasonic sensor system that provides acceptable performance. Designing an under-display ultrasonic sensor system for foldable display devices presents additional challenges because a foldable display includes a display stiffener, which helps to maintain the physical integrity of the display stack when the foldable display is folded and unfolded. The present inventors have found that display stiffeners can severely attenuate ultrasonic waves in frequency ranges that are suitable for ultrasonic fingerprint sensors. Integrating an ultrasonic sensor system into an appliance, an architectural feature (such as a wall, a door a door handle), an automobile component, etc., can also present design challenges, including but not limited to the attenuation of ultrasonic waves by layers that reside between the ultrasonic sensor system and an outer surface of the device or structure.

Some disclosed implementations include an ultrasonic sensor stack and one or more acoustic resonators. The acoustic resonator(s) may be configured to enhance ultrasonic waves transmitted by the ultrasonic sensor stack in an ultrasonic frequency range that is suitable for ultrasonic fingerprint sensors. In some examples, the acoustic resonator(s) may include one or more low-impedance layers residing between a first higher-impedance layer and a second higher-impedance layer. Each of the one or more low-impedance layers may have a lower acoustic impedance than an acoustic impedance of the first higher-impedance layer or an acoustic impedance of the second higher-impedance layer. At least one low-impedance layer may have a thickness corresponding to a multiple of a half wavelength of a peak frequency of the acoustic resonator. (As used herein, a "multiple" of X refers to any positive integer multiplied by X, including the integer one. In other words, a "multiple" of X may be X, 2X, 3X, etc.) The peak frequency may be within a frequency range from 1 MHz. to 20 MHz. Examples of other configurations of acoustic resonators are described below.

Particular implementations of the subject matter described in this disclosure may be implemented to realize one or more of the following potential advantages. Some disclosed devices can provide enhanced transmission of ultrasonic waves in an ultrasonic frequency range that is suitable for ultrasonic fingerprint sensors, as compared to the transmission of ultrasonic waves of devices that lack one or more of the disclosed acoustic resonators. For example, in some implementations, the acoustic resonator(s) may be configured to amplify ultrasonic waves transmitted by the ultrasonic sensor stack in an ultrasonic frequency range that is suitable for ultrasonic fingerprint sensors. In some examples, at least acoustic resonator may be configured to function as a filter to only allow ultrasonic waves of the suitable frequency range to pass. Implementations wherein the acoustic resonator(s) reside between an ultrasonic sensor stack and layers of a device or structure may be manufactured without modifying the existing device or structure, thereby avoiding additional manufacturing cost and time.

FIG. 1 is a block diagram that shows example components of an apparatus according to some disclosed implementations. As with other disclosed implementations, the numbers, types and arrangements of elements shown in FIG. 1 are merely presented by way of example. Although not shown in FIG. 1, the apparatus 100 may include other components, such as a cover (which may be, or may include, a cover glass), one or more adhesive layers, one or more electrode layers, etc. Some examples are described below. In some implementations, the apparatus 100 may be a mobile device that includes the elements shown in FIG. 1.

According to this example, the apparatus 100 includes an ultrasonic sensor stack 105. In some examples, the ultrasonic sensor stack 105 includes an ultrasonic transceiver layer 101 and a thin-film transistor (TFT) layer 102. In some such examples, the ultrasonic transceiver layer 101 may be configured to function as both an ultrasonic transmitter and an ultrasonic receiver. According to some implementations, the ultrasonic transceiver layer 101 may be a single piezoelectric layer, whereas in other implementations the ultrasonic transceiver layer 101 may be a multilayer piezoelectric structure, or an array of such structures.

For example, in some implementations, the ultrasonic transceiver layer 101 may include a piezoelectric layer, such as a layer of PVDF polymer or a layer of PVDF-TrFE copolymer. In some implementations, other piezoelectric materials may be used in the ultrasonic transceiver layer 101, such as aluminum nitride (AlN) or lead zirconate titanate (PZT). Some alternative implementations may include separate ultrasonic transmitter and ultrasonic receiver layers.

The ultrasonic transceiver layer 101 may, in some alternative examples, include an array of ultrasonic transducer elements, such as an array of piezoelectric micromachined ultrasonic transducers (PMUTs), an array of capacitive micromachined ultrasonic transducers (CMUTs), etc. In some such examples, a piezoelectric receiver layer, PMUT elements in a single-layer array of PMUTs, or CMUT elements in a single-layer array of CMUTs, may be used as ultrasonic transmitters as well as ultrasonic receivers.

The TFT layer 102, when present, may be a type of metal-oxide-semiconductor field-effect transistor (MOSFET) made by depositing thin films of an active semiconductor layer as well as a dielectric layer and metallic contacts over a TFT substrate. In some examples, the TFT substrate may be a non-conductive material such as glass. According to some implementations, the TFT layer 102 may have a thickness that is in the range of 50 microns to 400 microns.

According to this example, the apparatus 100 includes an acoustic resonator 103. The acoustic resonator 103 may be configured to enhance ultrasonic waves transmitted by the ultrasonic sensor stack in an ultrasonic frequency range that is suitable for ultrasonic fingerprint sensors. In some examples, the acoustic resonator 103 may include one or more low-impedance layers residing between a first higher-impedance layer and a second higher-impedance layer. Each of the one or more low-impedance layers may have a lower acoustic impedance than an acoustic impedance of the first higher-impedance layer or an acoustic impedance of the second higher-impedance layer. At least one low-impedance layer may have a thickness corresponding to a multiple of a half wavelength of a peak frequency of the acoustic resonator 103. The peak frequency may be within a frequency range from 1 MHz. to 20 MHz.

In some examples, the acoustic resonator 103 may be, or may include, a first higher-impedance layer having a thickness corresponding to a multiple of a half wavelength of a peak frequency of the acoustic resonator 103. In some such implementations, the acoustic resonator 103 may include one or more first low-impedance layers residing between a first side of the first higher-impedance layer and the ultrasonic sensor stack 105. In some examples, each layer of the one or more first low-impedance layers may have a lower acoustic impedance than an acoustic impedance of the first higher-impedance layer. In some instances, each layer of the one or more first low-impedance layers may have a thickness corresponding to a multiple of a quarter wavelength of the peak frequency of the acoustic resonator 103.

In some such implementations, the acoustic resonator 103 may include one or more second low-impedance layers residing proximate a second side of the first higher-impedance layer. In some examples, each layer of the one or more second low-impedance layers may have a lower acoustic impedance than the acoustic impedance of the first higher-impedance layer. In some instances, each layer of the one or more second low-impedance layers may have a thickness corresponding to a multiple of the quarter wavelength of the peak frequency of the acoustic resonator 103.

In some examples, the apparatus 100 may include a control system 106. The control system 106 (when present) may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof. The control system 106 also may include (and/or be configured for communication with) one or more memory devices, such as one or more random access memory (RAM) devices, read-only memory (ROM) devices, etc. Accordingly, the apparatus 100 may have a memory system that includes one or more memory devices, though the memory system is not shown in FIG. 1. The control system 106 may be capable of receiving and processing data from the ultrasonic transceiver layer 101 and/or from an array of sensor pixels, e.g., as described below. In some implementations, functionality of the control system 106 may be partitioned between one or more controllers or processors, such as a dedicated sensor controller and an applications processor of a mobile device.

Some implementations of the apparatus 100 may include an interface system 107. In some examples, the interface system may include a wireless interface system. In some implementations, the interface system may include a user interface system, one or more network interfaces, one or more interfaces between the control system 106 and a memory system and/or one or more interfaces between the control system 106 and one or more external device interfaces (e.g., ports or applications processors).

The interface system 107 may be configured to provide communication (which may include wired or wireless communication, such as electrical communication, radio communication, etc.) between components of the apparatus 100. In some such examples, the interface system 107 may be configured to provide communication between the control system 106 and the ultrasonic receiver layer 101, to provide communication between the control system 106 and the display stack 109 and/or to provide communication between the control system 106 and an array of sensor pixels. According to some such examples, a portion of the interface system 107 may couple at least a portion of the control system 106 to the ultrasonic receiver layer 101 and/or an array of sensor pixels, e.g., via electrically conducting material.

According to some examples, the interface system 107 may be configured to provide communication between the apparatus 100 and other devices and/or human beings. In some such examples, the interface system 107 may include one or more user interfaces. The interface system 107 may, in some examples, include one or more network interfaces and/or one or more external device interfaces (such as one or more universal serial bus (USB) interfaces). In some implementations, the apparatus 100 may include a memory system. The interface system 107 may, in some examples, include at least one interface between the control system 106 and a memory system.

In some implementations, the apparatus may include a display stack 109. According to some examples, the display stack 109 may be a foldable display stack that includes a display stiffener and display stack layers. The display stiffener, when present, may have a relatively high acoustic impedance, e.g., an acoustic impedance of 10 MRayls or more. In some implementations, the display stiffener may be, or may include, a metal layer (e.g., a stainless steel layer having an acoustic impedance of approximately 47 MRayls). The display stack layers may, in some examples, include layers of a light-emitting diode (LED) display, such as an organic light-emitting diode (OLED) display. Some examples of display stack layers are provided in this disclosure.

According to some implementations, at least a portion of the display stack 109 may reside between the ultrasonic sensor stack 105 and the acoustic resonator 103. In some such examples, the acoustic resonator 103 may be, or may include, a high-impedance layer having a thickness corresponding to a multiple of a half wavelength of a peak frequency of the acoustic resonator 103. According to some examples, the acoustic resonator 103 may be, or may include, a cover glass on an outer surface of the display stack 109.

The apparatus 100 may be used in a variety of different contexts, many examples of which are disclosed herein. For example, in some implementations a mobile device, such as a cell phone, a smart phone, a tablet, a laptop (e.g., a laptop touchpad), etc., may include at least a portion of the apparatus 100. In some implementations, a wearable device may include at least a portion of the apparatus 100. The wearable device may, for example, be a watch, a bracelet, an armband, a wristband, a ring, a headband or a patch. In some implementations, the control system 106 may reside in more than one device. For example, a portion of the control system 106 may reside in a wearable device and another portion of the control system 106 may reside in another device, such as a mobile device (e.g., a smartphone or a tablet computer) and/or a server. The interface system 107 also may, in some such examples, reside in more than one device.

Figure 2:
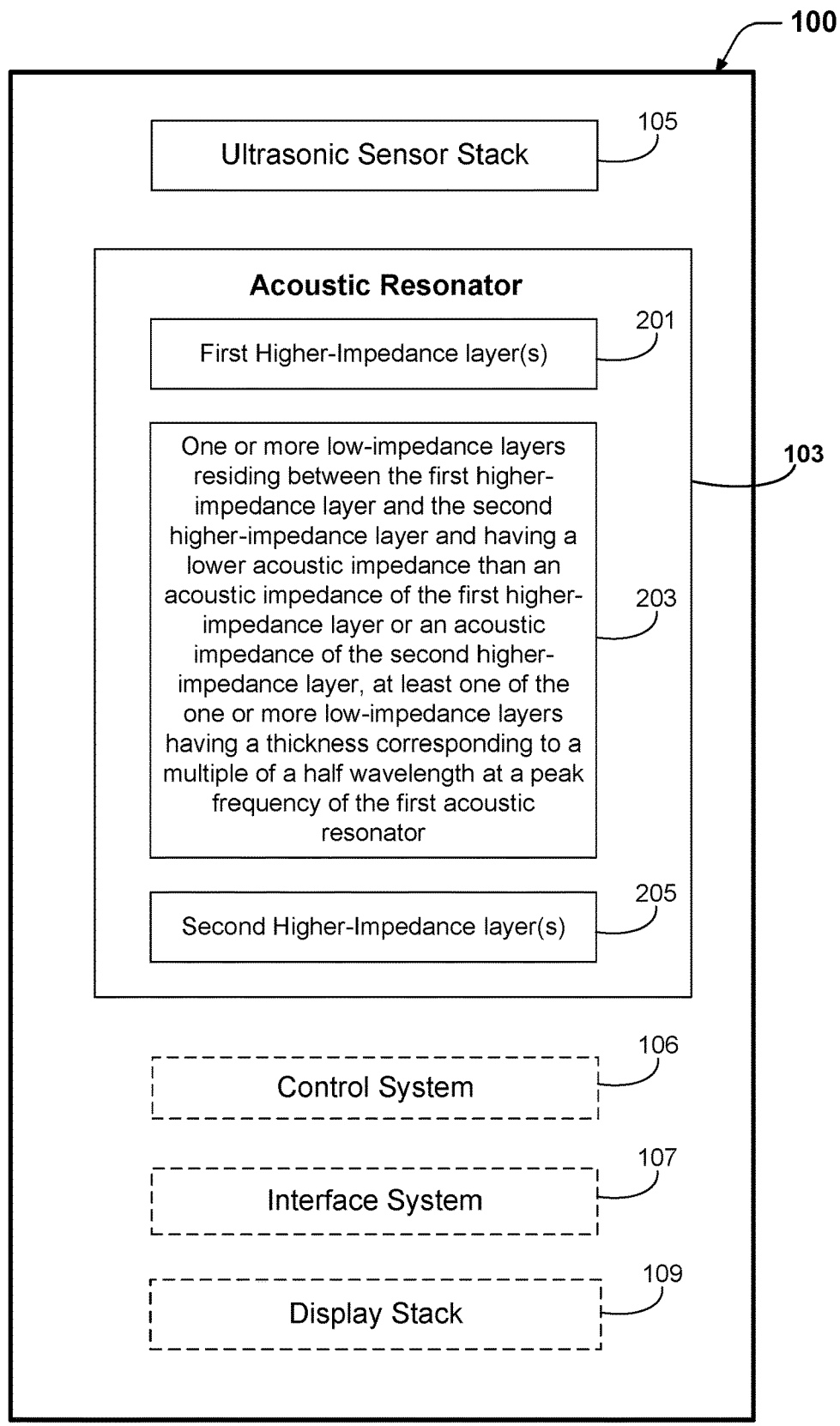
FIG. 2 is another block diagram that shows example components of an apparatus according to some disclosed implementations.

FIG. 2 is another block diagram that shows example components of an apparatus according to some disclosed implementations. As with other disclosed implementations, the numbers, types and arrangements of elements shown in FIG. 2 are merely presented by way of example. Although not shown in FIG. 2, the apparatus 100 may include other components, such as a cover (which may be, or may include, a cover glass), one or more adhesive layers, one or more electrode layers, etc. Some examples are described below. In some implementations, the apparatus 100 may be a mobile device that includes the elements shown in FIG. 2.

The blocks of FIG. 2 represent a class of implementations of FIG. 1. Accordingly, the ultrasonic sensor stack 105, the optional control system 106, the optional interface system 107 and the optional display stack 109 may as described above with reference to FIG. 1 (or as described elsewhere herein).

According to this example, the apparatus 100 includes an acoustic resonator 103. The acoustic resonator 103 may be configured to enhance ultrasonic waves transmitted by the ultrasonic sensor stack in an ultrasonic frequency range that is suitable for ultrasonic fingerprint sensors. In this example, the acoustic resonator 103 includes first higher-impedance layer(s) 201, second higher-impedance layer(s) 205 and one or more low-impedance layers 203 residing between the first higher-impedance layer(s) 201 and the second higher-impedance layer(s) 205. According to this example, each of the one or more low-impedance layers 203 has a lower acoustic impedance than the acoustic impedance of the first higher-impedance layer(s) 201 and a lower acoustic impedance than the acoustic impedance of the second higher-impedance layer(s) 205. In this implementation, at least one of the one or more low-impedance layers 203 has a thickness corresponding to a multiple of a half wavelength at a peak frequency of the acoustic resonator 103. The peak frequency may be within a frequency range from 1 MHz. to 20 MHz.

According to some examples, the first higher-impedance layer(s) 201 and/or the second higher-impedance layer(s) 205 may have a thickness corresponding to a multiple of a quarter wavelength corresponding to the peak frequency of the acoustic resonator 103. In some implementations, the first higher-impedance layer(s) 201 and/or the second higher-impedance layer(s) 205 may be multi-layer structures.

FIG. 3A shows an example cross-section through an apparatus according to some disclosed implementations. As with other disclosed implementations, the numbers, types and arrangements of elements shown in FIG. 3A are merely presented by way of example. Although not shown in FIG. 3A, the apparatus 100 may include other components, such as a cover (which may be, or may include, a cover glass), one or more additional adhesive layers, one or more electrode layers, etc. Some examples are described below. In some implementations, the apparatus 100 may be a mobile device that includes the elements shown in FIG. 3A.

The elements of FIG. 3A represent a class of implementations of FIG. 2. Accordingly, the ultrasonic sensor stack 105 and the acoustic resonator 103 (including the first higher-impedance layer(s) 201, the one or more low-impedance layers 203 and the second higher-impedance layer(s) 205) may be as described above with reference to FIG. 2 (or as described elsewhere herein). Here, the one or more low-impedance layers 203 have a thickness corresponding to a multiple of a half wavelength of a peak frequency (shown as $N\lambda/2$ in FIG. 3A) of the acoustic resonator 103. (As noted above, as used herein a "multiple" of X refers to any positive integer multiplied by X, including the integer one. In other words, a "multiple" of $N\lambda/2$ may be $\lambda/2$, $\lambda$, $3\lambda/2$, $2\lambda$, etc.) The peak frequency may be within a frequency range from 1 MHz. to 20 MHz.

In this example, the ultrasonic sensor stack 105 is attached to the acoustic resonator 103 via an adhesive layer 301. In some examples, the adhesive layer 301 may be, or may include, a thin pressure-sensitive adhesive (PSA). In some instances, the adhesive layer 301 may have a thickness that is in the range of 2 microns to 10 microns. According to this example, each of the one or more low-impedance layers 203 has a lower acoustic impedance than the acoustic impedance of the first higher-impedance layer(s) 201 and a lower acoustic impedance than the acoustic impedance of the second higher-impedance layer(s) 205.

In some instances, the acoustic impedance of the first higher-impedance layer(s) 201 and the acoustic impedance of the second higher-impedance layer(s) 205 may be much higher (e.g., four times higher, five times higher, six times higher, seven times higher, eight times higher, nine times higher, an order of magnitude higher, eleven times higher, twelve times higher, thirteen times higher, fourteen times higher, fifteen times higher, sixteen times higher, seventeen times higher, eighteen times higher, nineteen times higher, twenty times higher, etc.) than the acoustic impedance of each of the one or more low-impedance layers 203. For example, the first higher-impedance layer(s) 201 and/or the second higher-impedance layer(s) 205 may be, or may include, one or more metal layers (e.g., aluminum, copper or stainless steel, having acoustic impedances of approximately 17, 45 and 46 MRayls, respectively). In some such examples, the one or more low-impedance layers 203 may include one or more plastic layers (e.g., having acoustic impedances in the range of 1.7 to 4.2 MRayls).

According to some examples in which the acoustic impedance of the first higher-impedance layer(s) 201 and the acoustic impedance of the second higher-impedance layer(s) 205 are much higher than the acoustic impedance of each of the one or more low-impedance layers 203, the first higher-impedance layer(s) 201 and the second higher-impedance layer(s) 205 may be thin layers. In some such examples, the first higher-impedance layer(s) 201 and the second higher-impedance layer(s) 205 may each have a thickness corresponding to less than one-eighth of a wavelength at the peak frequency of the acoustic resonator. In some such examples, the first higher-impedance layer(s) 201 and/or the second higher-impedance layer(s) 205 may be metal layers having thicknesses of only a few microns, e.g., 2 microns, 3 microns, 4 microns, 5 microns, 6 microns, 7 microns, etc.

In some examples, the first higher-impedance layer(s) 201 and/or the second higher-impedance layer(s) 205 may be formed of the same material (e.g., the same type of metal) and may have identical acoustic impedances. According to some such examples, the apparatus 100 may be configured for use within an appliance (such as a refrigerator door), within an automobile or autonomous device component, within a structure of an office or a home (such as a wall, a door or a door handle), etc. The present inventors have found that if the one or more low-impedance layers 203 have a thickness corresponding to a multiple of a half wavelength of a peak frequency of the acoustic resonator 103, the acoustic impedance of the first higher-impedance layer(s) 201 and the acoustic impedance of the second higher-impedance layer(s) 205 are much higher than that of the one or more low-impedance layers 203, and the acoustic impedance of the first higher-impedance layer(s) 201 matches that of the second higher-impedance layer(s) 205, excellent ultrasonic transmission at the peak frequency of the acoustic resonator 103 may be obtained.

However, in some implementations the acoustic impedance of the first higher-impedance layer(s) 201 may not match that of the second higher-impedance layer(s) 205. In some such examples, the acoustic impedance of the first higher-impedance layer(s) 201 may be less than that of the second higher-impedance layer(s) 205. According to some such examples, the first higher-impedance layer(s) 201 may be, or may include, a glass layer and the second higher-impedance layer(s) 205 may be, or may include, a metal layer. In some such examples the apparatus 100 may include a foldable display stack and the second higher-impedance layer(s) 205 may be a display stiffener. According to some such examples, the first higher-impedance layer(s) 201 may be a glass layer of the display stack.

FIG. 3B shows another example cross-section through an apparatus according to some disclosed implementations. As with other disclosed implementations, the numbers, types and arrangements of elements shown in FIG. 3B are merely presented by way of example. Although not shown in FIG. 3B, the apparatus 100 may include other components, one or more additional adhesive layers, one or more electrode layers, etc. Some examples are described below. In some implementations, the apparatus 100 may be a mobile device that includes the elements shown in FIG. 3B.

The elements of FIG. 3B represent another class of implementations of FIG. 2. Accordingly, the ultrasonic sensor stack 105, the first higher-impedance layer(s) 201, the one or more low-impedance layers 203 and the second higher-impedance layer(s) 205 may be as described above with reference to FIG. 2 (or as described elsewhere herein). Here, the one or more low-impedance layers 203 have a thickness corresponding to a multiple of a half wavelength of a peak frequency (shown as $N\lambda/2$ in FIG. 3B) of the acoustic resonator 103. The peak frequency may be within a frequency range from 1 MHz. to 20 MHz.

In this example, the ultrasonic sensor stack 105 is attached to the acoustic resonator 103 via an adhesive layer 301. In some examples, the adhesive layer 301 may be, or may include, a thin pressure-sensitive adhesive (PSA). In some instances, the adhesive layer 301 may have a thickness in the range of 2 microns to 10 microns. According to this example, each of the one or more low-impedance layers 203 has a lower acoustic impedance than the acoustic impedance of the first higher-impedance layer(s) 201 and a lower acoustic impedance than the acoustic impedance of the second higher-impedance layer(s) 205.

In this particular class of implementations, the acoustic impedance of the first higher-impedance layer(s) 201 and the acoustic impedance of the second higher-impedance layer(s) 205 is higher than, but not much higher than, the acoustic impedance of each of the one or more low-impedance layers 203. For example, the acoustic impedance of the first higher-impedance layer(s) 201 and/or the second higher-impedance layer(s) 205 may be about 50% higher, about 75% higher, about 100% higher, about 125% higher, about 150% higher, about 175% higher, about 200% higher, about 225% higher, about 250% higher, about 275% higher, about 300% higher, etc., than the acoustic impedance of each of the one or more low-impedance layers 203. For example, the first higher-impedance layer(s) 201 and/or the second higher-impedance layer(s) 205 may be, or may include, one or more hard plastic layers (e.g., acrylic plexiglass, polyvinyl chloride (PVC), polyoxymethylene (POM, commercially available as Delrin® acetal homopolymer) and/or polyvinylidene difluoride (PVDF), having acoustic impedances of approximately 3.26, 3.27, 3.45 and 4.2 MRayls, respectively). In some such examples, the one or more low-impedance layers 203 may include one or more soft plastic layers (e.g., ethyl vinyl acetate, low-density polyethylene or polyurethane, having acoustic impedances of approximately 1.69, 1.79, and 1.80 MRayls, respectively).

According to some examples in which the acoustic impedance of the first higher-impedance layer(s) 201 and the acoustic impedance of the second higher-impedance layer(s) 205 are higher than, but not much higher than, the acoustic impedance of each of the one or more low-impedance layers 203, the first higher-impedance layer(s) 201 and the second higher-impedance layer(s) 205 may have a thickness corresponding to a multiple of one-fourth of a wavelength (shown in FIG. 3B as $N\lambda/4$) at the peak frequency of the acoustic resonator 103. For example, for a low-impedance material (e.g., a material having an acoustic impedance in the range of 2 to 4 MRayls), $\lambda/4$ for a suitable peak frequency for ultrasonic imaging (e.g., a peak frequency in the range of 1 MHz to 20 MHz) may correspond to a layer thickness in the range of 30 μm to 80 μm. For a high-impedance material (e.g., a material having an acoustic impedance in the range of 10 to 50 MRayls), $\lambda/4$ for a suitable peak frequency for ultrasonic imaging may correspond to a layer thickness in the range of 100 µm to 300 µm.

FIG. 3C shows an example cross-section through one of the higher-impedance layers of FIG. 3B according to some disclosed implementations. As with other disclosed implementations, the numbers, types and arrangements of elements shown in FIG. 3B are merely presented by way of example.

FIG. 3C is provided to illustrate the point that in some implementations, the first higher-impedance layer(s) 201 and/or the second higher-impedance layer(s) 205 may be multi-layer structures. According to this example, the first higher-impedance layer(s) 201 and/or the second higher-impedance layer(s) 205 are multi-layer structures that include alternating layers of two different types of materials, Material 1 and Material 2. In this example, Material 1 has a different acoustic impedance than that of Material 2. In some examples, Material 1 has a lower acoustic impedance than that of Material 2. In one such example, Material 1 may be, or may include, an optically clear adhesive (OCA) and Material 2 may be, or may include, polyethylene terephthalate (PET). According to this example, both the thicknesses of the individual layers of Material 1 and Material 2, as well as the overall thickness of the multi-layer structure, correspond to a multiple of one-fourth of a wavelength (shown in FIG. 3C as $N\lambda/4$) at the peak frequency of the acoustic resonator 103. For example, assuming an OCA impedance in the range of 1.8-2.1 MRayls, one-fourth of a wavelength may correspond to a layer thickness in the range of 35-60 um, depending on the peak frequency. In another example, assuming a PET impedance in the range of 2.8-3.4 MRayls, one-fourth of a wavelength may correspond to a layer thickness in the range of 50-90 um, depending on the peak frequency.

Figure 4A:
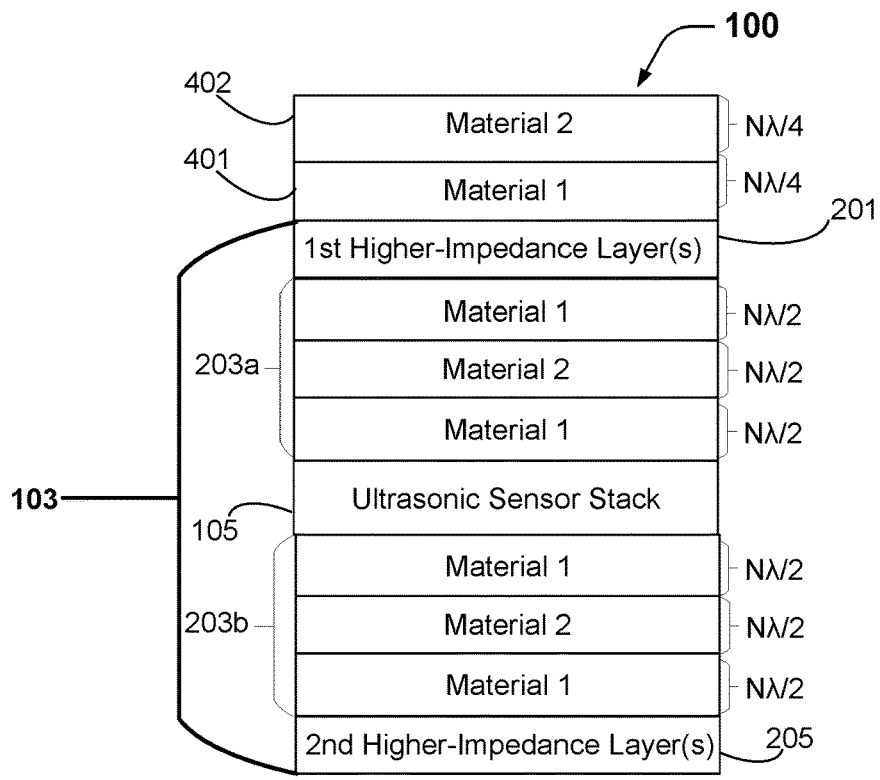
FIG. 4A shows another example cross-section through an apparatus according to some disclosed implementations.

FIG. 4A shows another example cross-section through an apparatus according to some disclosed implementations. As with other disclosed implementations, the numbers, types and arrangements of elements shown in FIG. 4A are merely presented by way of example. Although not shown in FIG. 4A, the apparatus 100 may include other components, one or more adhesive layers, one or more electrode layers, etc. Some examples are described below. In some implementations, the apparatus 100 may be a mobile device that includes the elements shown in FIG. 4A.

The elements of FIG. 4A represent another class of implementations of FIG. 2. According to this class of implementations, the ultrasonic sensor stack 105 resides between the first higher-impedance layer(s) 201 and the second higher-impedance layer(s) 205.

In the example shown in FIG. 4A, the one or more low-impedance layers 203 include low-impedance layers 203a residing between the ultrasonic sensor stack 105 and the first higher-impedance layer(s) 201, as well as low-impedance layers 203b residing between the ultrasonic sensor stack 105 and the second higher-impedance layer(s) 205. According to this example, each of the low-impedance layers 203a and each of the low-impedance layers 203b has a lower acoustic impedance than the acoustic impedance of the first higher-impedance layer(s) 201 and a lower acoustic impedance than the acoustic impedance of the second higher-impedance layer(s) 205.

In some instances, the acoustic impedance of the first higher-impedance layer(s) 201 and the acoustic impedance of the second higher-impedance layer(s) 205 may be much higher (e.g., four times higher, five times higher, six times higher, seven times higher, eight times higher, nine times higher, an order of magnitude higher, eleven times higher, twelve times higher, thirteen times higher, fourteen times higher, fifteen times higher, sixteen times higher, seventeen times higher, eighteen times higher, nineteen times higher, twenty times higher, etc.) than the acoustic impedance of each of the low-impedance layers 203a and 203b. For example, the first higher-impedance layer(s) 201 and/or the second higher-impedance layer(s) 205 may be, or may include, one or more metal layers (e.g., aluminum, copper or stainless steel, having acoustic impedances of approximately 17, 45 and 46 MRayls, respectively). In some such examples, each of the low-impedance layers 203a and 203b may include one or more plastic layers (e.g., having acoustic impedances in the range of 1.7 to 4.2 MRayls).

According to some examples in which the acoustic impedance of the first higher-impedance layer(s) 201 and the acoustic impedance of the second higher-impedance layer(s) 205 are much higher than the acoustic impedance of each of the low-impedance layers 203a and 203b, the first higher-impedance layer(s) 201 and the second higher-impedance layer(s) 205 may be thin layers. In some such examples, the first higher-impedance layer(s) 201 and the second higher-impedance layer(s) 205 may each have a thickness corresponding to less than one-eighth of a wavelength at the peak frequency of the acoustic resonator. In some such examples, the first higher-impedance layer(s) 201 and/or the second higher-impedance layer(s) 205 may be metal layers having thicknesses of only a few microns, e.g., 2 microns, 3 microns, 4 microns, 5 microns, 6 microns, 7 microns, etc.

According to this example, the low-impedance layers 203a and the low-impedance layers 203b each have a thickness corresponding to a multiple of a half wavelength at the peak frequency of the acoustic resonator 103. In this specific example, the low-impedance layers 203a and the low-impedance layers 203b each include alternating layers of a first material (Material 1) and a second material (Material 2). In this implementation, Material 1 has a different acoustic impedance from that of Material 2. In some examples, Material 1 has a lower acoustic impedance than that of Material 2. In one such example, Material 1 may be, or may include, an optically clear adhesive (OCA) and Material 2 may be, or may include, polyethylene terephthalate (PET). However, Material 1 and Material 2 may or may not be OCA and PET and may instead be various other materials, depending on the particular implementation. In this example, Material 1 and Material each have a thickness corresponding to a multiple of a half wavelength at the peak frequency of the acoustic resonator 103. The peak frequency may be within a frequency range from 1 MHz. to 20 MHz.

In the example shown in FIG. 4A, the apparatus 100 includes additional layers of Material 1 and Material 2 between the higher-impedance layer(s) 201 and an outer surface of the apparatus 100. According to this example, layer 401 (the layer of Material 1) and layer 402 (the layer of Material 2) each have a thickness corresponding to a multiple of a quarter wavelength at the peak frequency of the acoustic resonator 103.

Figure 4B:
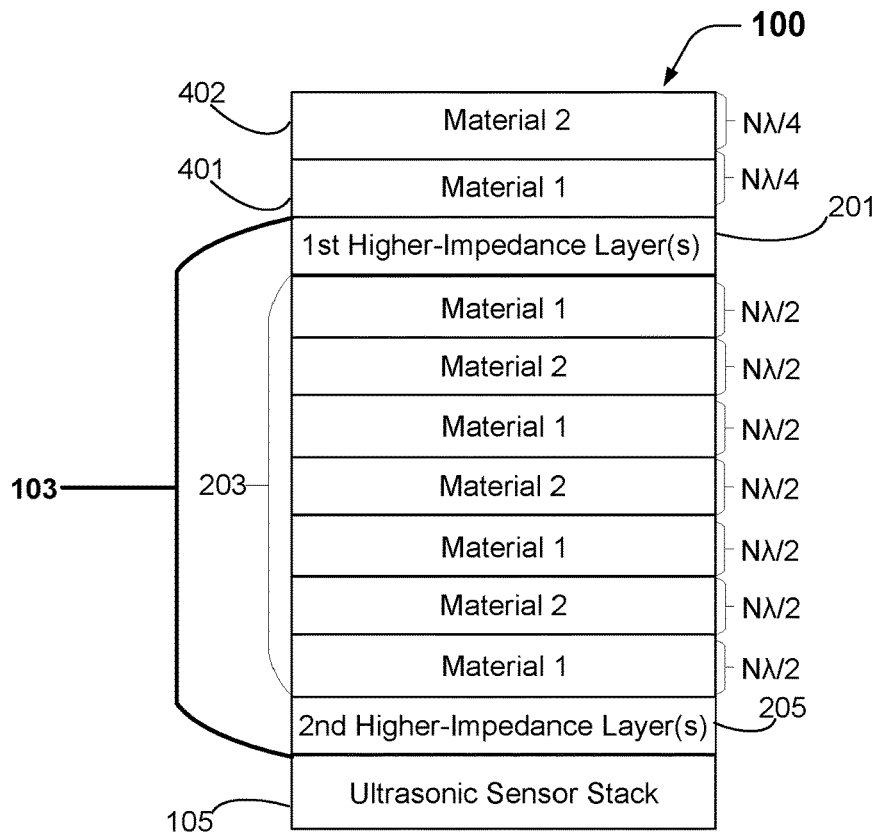
FIG. 4B shows another example cross-section through an apparatus according to some disclosed implementations.

FIG. 4B shows another example cross-section through an apparatus according to some disclosed implementations. As with other disclosed implementations, the numbers, types and arrangements of elements shown in FIG. 4B are merely presented by way of example. Although not shown in FIG. 4B, the apparatus 100 may include other components, one or more adhesive layers, one or more electrode layers, etc. Some examples are described below. In some implementations, the apparatus 100 may be a mobile device that includes the elements shown in FIG. 4B.

The elements of FIG. 4B represent another example of the class of implementations that are represented by FIG. 3A. In this example, the acoustic resonator 103 includes a first higher-impedance layer 201, a second higher-impedance layer 205 and multiple low-impedance layers 203 residing between the first higher-impedance layer 201 and the second higher-impedance layer 205. According to this example, each of the low-impedance layers 203 has a lower acoustic impedance than the acoustic impedance of the first higher-impedance layer 201 and a lower acoustic impedance than the acoustic impedance of the second higher-impedance layer 205. In this implementation, each of the low-impedance layers 203 has a thickness corresponding to a multiple of a half wavelength of a peak frequency of the acoustic resonator 103. The peak frequency may be within a frequency range from 1 MHz. to 20 MHz.

In this example, the acoustic impedance of the first higher-impedance layer(s) 201 and the acoustic impedance of the second higher-impedance layer(s) 205 is much higher than the acoustic impedance of each of the low-impedance layers 203. For example, the first higher-impedance layer(s) 201 and/or the second higher-impedance layer(s) 205 may be, or may include, one or more metal layers (e.g., aluminum, copper or stainless steel, having acoustic impedances of approximately 17, 45 and 46 MRayls, respectively). In some such examples, the low-impedance layers 203 may include plastic layers (e.g., having acoustic impedances in the range of 1.7 to 4.2 MRayls).

According to some examples in which the first higher-impedance layer(s) 201 and the acoustic impedance of the second higher-impedance layer(s) 205 are much higher than the acoustic impedance of each of the one or more low-impedance layers 203, the first higher-impedance layer(s) 201 and the second higher-impedance layer(s) 205 may be thin layers. In some such examples, the first higher-impedance layer(s) 201 and the second higher-impedance layer(s) 205 may have a thickness corresponding to less than one-eighth of a wavelength at the peak frequency of the acoustic resonator. In some such examples, the first higher-impedance layer(s) 201 and/or the second higher-impedance layer(s) 205 may be metal layers having thicknesses of only a few microns, e.g., 2 microns, 3 microns, 4 microns, 5 microns, 6 microns, 7 microns, etc.

According to this specific example, the low-impedance layers 203 include alternating layers of a first material (Material 1) and a second material (Material 2). Here, Material 1 has a different acoustic impedance from that of Material 2. In some examples, Material 1 has a lower acoustic impedance than that of Material 2. In one such example, Material 1 may be, or may include, an optically clear adhesive (OCA) and Material 2 may be, or may include, polyethylene terephthalate (PET). However, Material 1 and Material 2 may or may not be OCA and PET and may instead be various other materials, depending on the particular implementation.

In the example shown in FIG. 4B, the apparatus 100 includes additional layers of Material 1 and Material 2 between the higher-impedance layer(s) 201 and an outer surface of the apparatus 100. According to this example, layer 401 (the layer of Material 1) and layer 402 (the layer of Material 2) each have a thickness corresponding to a multiple of a quarter wavelength at the peak frequency of the acoustic resonator 103.

Figure 5:
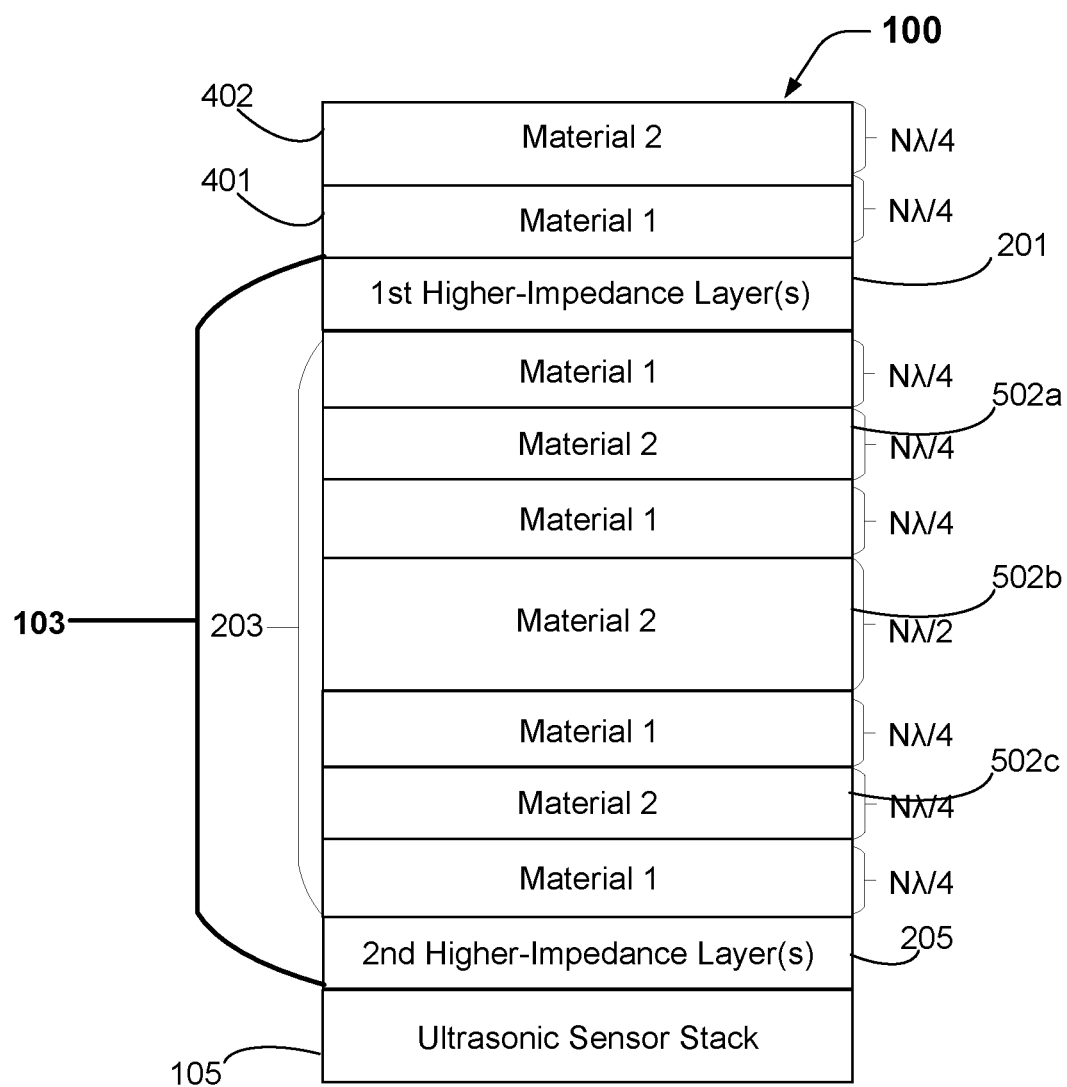
FIG. 5 shows another example cross-section through an apparatus according to some disclosed implementations.

FIG. 5 shows another example cross-section through an apparatus according to some disclosed implementations. As with other disclosed implementations, the numbers, types and arrangements of elements shown in FIG. 5 are merely presented by way of example. Although not shown in FIG. 5, the apparatus 100 may include other components, one or more adhesive layers, one or more electrode layers, etc. Some examples are described below. In some implementations, the apparatus 100 may be a mobile device that includes the elements shown in FIG. 5.

The elements of FIG. 5 represent another example of the class of implementations that are represented by FIG. 3A. In this example, the acoustic resonator 103 includes a first higher-impedance layer 201, a second higher-impedance layer 205 and multiple low-impedance layers 203 residing between the first higher-impedance layer 201 and the second higher-impedance layer 205. According to this example, each of the low-impedance layers 203 has a lower acoustic impedance than the acoustic impedance of the first higher-impedance layer 201 and a lower acoustic impedance than the acoustic impedance of the second higher-impedance layer 205.

In this example, the acoustic impedance of the first higher-impedance layer(s) 201 and the acoustic impedance of the second higher-impedance layer(s) 205 is much higher than the acoustic impedance of each of the low-impedance layers 203. For example, the first higher-impedance layer(s) 201 and/or the second higher-impedance layer(s) 205 may be, or may include, one or more metal layers (e.g., aluminum, copper or stainless steel, having acoustic impedances of approximately 17, 45 and 46 MRayls, respectively). In some such examples, the low-impedance layers 203 may include plastic layers (e.g., having acoustic impedances in the range of 1.7 to 4.2 MRayls).

According to some examples in which the first higher-impedance layer(s) 201 and the acoustic impedance of the second higher-impedance layer(s) 205 are much higher than the acoustic impedance of each of the one or more low-impedance layers 203, the first higher-impedance layer(s) 201 and the second higher-impedance layer(s) 205 may be thin layers. In some such examples, the first higher-impedance layer(s) 201 and the second higher-impedance layer(s) 205 may have a thickness corresponding to less than one-eighth of a wavelength at the peak frequency of the acoustic resonator. In some such examples, the first higher-impedance layer(s) 201 and/or the second higher-impedance layer(s) 205 may be metal layers having thicknesses of only a few microns, e.g., 2 microns, 3 microns, 4 microns, 5 microns, 6 microns, 7 microns, etc.

According to this specific example, the low-impedance layers 203 include alternating layers of a first material (Material 1) and a second material (Material 2). Here, Material 1 has a different acoustic impedance from that of Material 2. In some examples, Material 1 has a lower acoustic impedance than that of Material 2. In one such example, Material 1 may be, or may include, an optically clear adhesive (OCA) and Material 2 may be, or may include, polyethylene terephthalate (PET). However, Material 1 and Material 2 may or may not be OCA and PET and may instead be various other materials, depending on the particular implementation. According to this example, the layers 502a, 502b and 502c are layers of Material 2 and the other low-impedance layers 203 are layers of Material 1.

In this implementation, only one of the low-impedance layers 203, the middle layer 502b, has a thickness corresponding to a multiple of a half wavelength of a peak frequency of the acoustic resonator 103. The other low-impedance layers 203, including 502a and 502c, each have a thickness corresponding to a multiple of a quarter wavelength of a peak frequency of the acoustic resonator 103. The peak frequency may be within a frequency range from 1 MHz. to 20 MHz.

In the example shown in FIG. 5, the apparatus 100 includes additional layers of Material 1 and Material 2 between the higher-impedance layer(s) 201 and an outer surface of the apparatus 100. According to this example, layer 401 (the layer of Material 1) and layer 402 (the layer of Material 2) each have a thickness corresponding to a multiple of a quarter wavelength at the peak frequency of the acoustic resonator 103.

Figure 6:
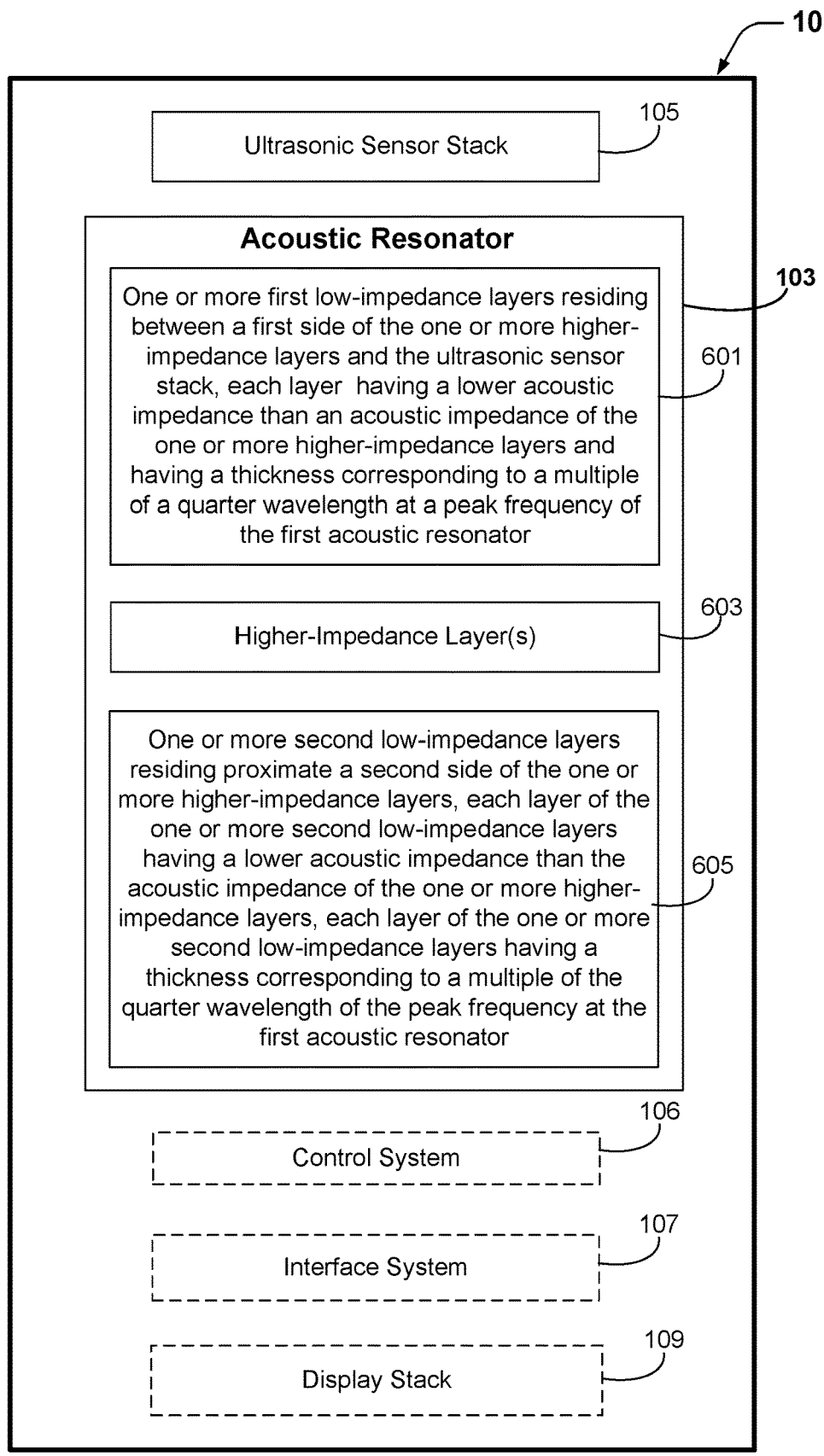
FIG. 6 is another block diagram that shows example components of an apparatus according to some disclosed implementations.

FIG. 6 is another block diagram that shows example components of an apparatus according to some disclosed implementations. As with other disclosed implementations, the numbers, types and arrangements of elements shown in FIG. 6 are merely presented by way of example. Although not shown in FIG. 6, the apparatus 100 may include other components, such as a cover (which may be, or may include, a cover glass), one or more adhesive layers, one or more electrode layers, etc. Some examples are described below.

The blocks of FIG. 6 represent another class of implementations of FIG. 1. Accordingly, the ultrasonic sensor stack 105, the optional control system 106, the optional interface system 107 and the optional display stack 109 may as described above with reference to FIG. 1 (or as described elsewhere herein). In some implementations, the apparatus 100 may be a mobile device that includes the elements shown in FIG. 6, or at least the ultrasonic sensor stack 105 and the acoustic resonator 103.

According to this example, the apparatus 100 includes an acoustic resonator 103. The acoustic resonator 103 may be configured to enhance ultrasonic waves transmitted by the ultrasonic sensor stack in an ultrasonic frequency range that is suitable for ultrasonic fingerprint sensors. In this example, the acoustic resonator 103 includes one or more higher-impedance layers (the higher-impedance layer(s) 603) having a thickness corresponding to a multiple of a half wavelength at a peak frequency of the acoustic resonator. In some examples, one or more of the higher-impedance layer(s) 603 may be, or may include, glass. According to some examples, one or more of the higher-impedance layer(s) 603 may be, or may include, metal (e.g., stainless steel, copper, aluminum, etc.)

According to this implementation, the acoustic resonator 103 also includes one or more first low-impedance layers (the low-impedance layer(s) 601) residing between a first side of the higher-impedance layer(s) 603 and the ultrasonic sensor stack 105. In this example, each layer of the low-impedance layer(s) 601 has a lower acoustic impedance than the acoustic impedance of the higher-impedance layer(s) 603. Moreover, in this implementation each layer of the low-impedance layer(s) 601 has a thickness corresponding to a multiple of a quarter wavelength at the peak frequency of the acoustic resonator 103. The peak frequency may be within a frequency range from 1 MHz. to 20 MHz.

In this example, the acoustic resonator 103 also includes one or more second low-impedance layers (the low-impedance layers 605) residing proximate a second side of the higher-impedance layer(s) 603. According to this example, the second side is opposite the first side. In some examples, the low-impedance layers 605 may reside between the second side of the higher-impedance layer(s) 603 and an outer surface of the apparatus 100. Here, each layer of the low-impedance layers 605 has a lower acoustic impedance than the acoustic impedance of the higher-impedance layer(s) 603. Moreover, in this example each layer of the low-impedance layers 605 has a thickness corresponding to a multiple of the quarter wavelength at the peak frequency of the acoustic resonator 103.

In some implementations, the apparatus 100 may include the display stack 109. In some such implementations, the low-impedance layers 605 may reside between the display stack 109 and the higher-impedance layer(s) 603.

Figure 7A:
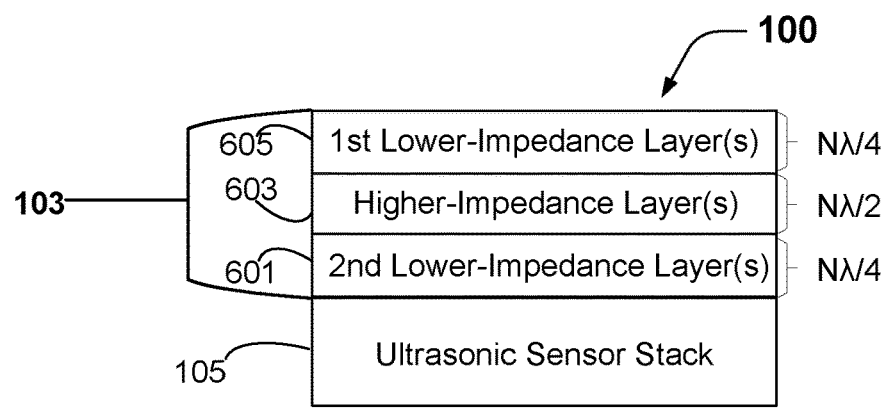
FIG. 7A shows an example cross-section through an apparatus according to some disclosed implementations.

FIG. 7A shows an example cross-section through an apparatus according to some disclosed implementations. As with other disclosed implementations, the numbers, types and arrangements of elements shown in FIG. 7A are merely presented by way of example. Although not shown in FIG. 7A, the apparatus 100 may include other components. Some examples are described below. In some implementations, the apparatus 100 may be a mobile device that includes the elements shown in FIG. 7A.

The elements of FIG. 7A represent a class of implementations of FIG. 6. Accordingly, in this example the acoustic resonator 103 includes the lower-impedance layer(s) 601, the higher-impedance layer(s) 603 and the lower-impedance layer(s) 605. The ultrasonic sensor stack 105, the lower-impedance layer(s) 601, the higher-impedance layer(s) 603 and the lower-impedance layer(s) 605 may be as described above with reference to FIG. 6 (or as described elsewhere herein). Here, the higher-impedance layer(s) 603 has or have a thickness corresponding to a multiple of a half wavelength at a peak frequency (shown as $N\lambda/2$ in FIG. 7A) of the acoustic resonator 103. In this example, the lower-impedance layer(s) 601 and the lower-impedance layer(s) 605 have a thickness corresponding to a multiple of a quarter wavelength at a peak frequency (shown as $N\lambda/4$ in FIG. 7A) of the acoustic resonator 103. The peak frequency may be within a frequency range from 1 MHz. to 20 MHz.

In some instances, the acoustic impedance of the higher-impedance layer(s) 603 may be much higher than the acoustic impedance of the lower-impedance layer(s) 601 and the acoustic impedance of the lower-impedance layer(s) 605. For example, the higher-impedance layer(s) 603 may be, or may include, one or more metal layers (e.g., aluminum, copper or stainless steel, having acoustic impedances of approximately 17, 45 and 46 MRayls, respectively). In some such examples, the lower-impedance layer(s) 601 or the lower-impedance layer(s) 605 may be, or may include, one or more plastic layers (e.g., having acoustic impedances in the range of 1.7 to 4.2 MRayls).

However, in other implementations, the acoustic impedance of the higher-impedance layer(s) 603 may be higher than, but not much higher than, the acoustic impedance of the lower-impedance layer(s) 601 and the acoustic impedance of the lower-impedance layer(s) 605. For example, the acoustic impedance of the higher-impedance layer(s) 603 may be about 50% higher, about 75% higher, about 100% higher, about 125% higher, about 150% higher, about 175% higher, about 200% higher, about 225% higher, about 250% higher, about 275% higher, about 300% higher, etc. than the acoustic impedance of the lower-impedance layer(s) 601 and the acoustic impedance of the lower-impedance layer(s) 605. For example, the higher-impedance layer(s) 603 may be, or may include, one or more hard plastic layers (e.g., acrylic plexiglass, polyvinyl chloride (PVC), polyoxymethylene (POM, commercially available as Delrin® acetal homopolymer) and/or polyvinylidene difluoride (PVDF), having acoustic impedances of approximately 3.26, 3.27, 3.45 and 4.2 MRayls, respectively). In some such examples, the lower-impedance layer(s) 601 and/or the lower-impedance layer(s) 605 may be, or may include, one or more soft plastic layers (e.g., ethyl vinyl acetate, low-density polyethylene or polyurethane, having acoustic impedances of approximately 1.69, 1.79, and 1.80 MRayls, respectively).

Figure 7B:
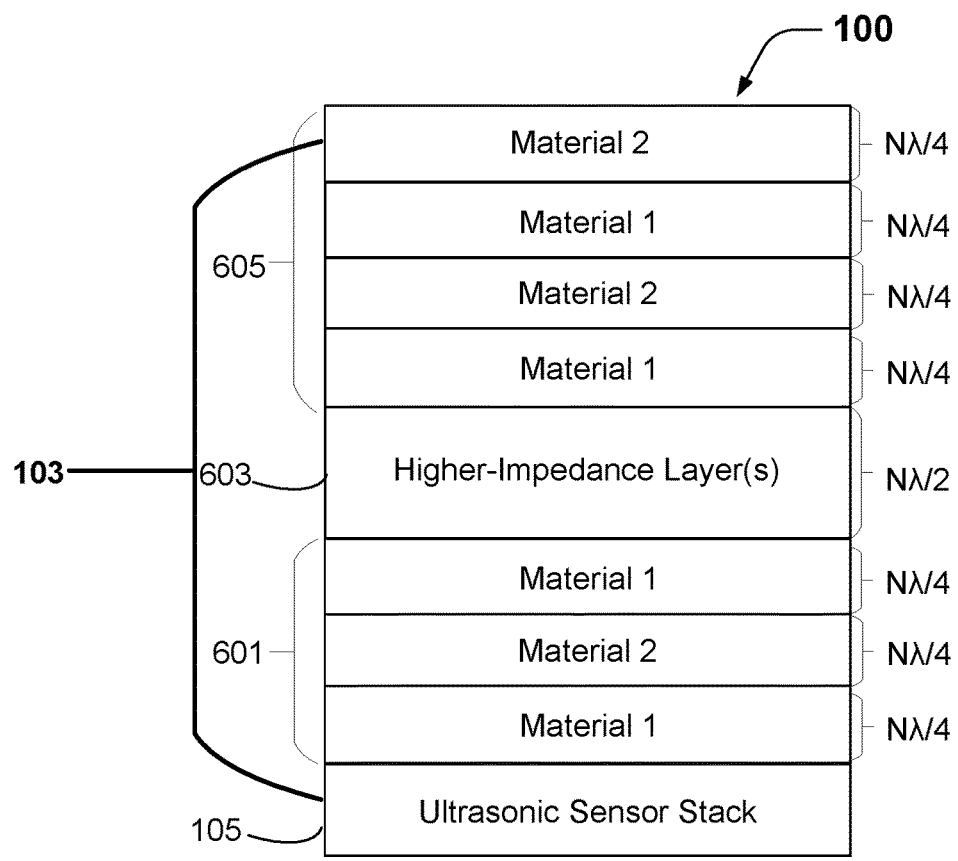
FIG. 7B shows another example cross-section through an apparatus according to some disclosed implementations.

FIG. 7B shows another example cross-section through an apparatus according to some disclosed implementations. As with other disclosed implementations, the numbers, types and arrangements of elements shown in FIG. 7B are merely presented by way of example. Although not shown in FIG. 7B, the apparatus 100 may include other components, one or more adhesive layers, one or more electrode layers, etc. Some examples are described below. In some implementations, the apparatus 100 may be a mobile device that includes the elements shown in FIG. 7B.

The elements of FIG. 7B represent another example of the class of implementations that are represented by FIG. 6. Accordingly, in this example the acoustic resonator 103 includes the lower-impedance layer(s) 601, the higher-impedance layer(s) 603 and the lower-impedance layer(s) 605. The ultrasonic sensor stack 105, the lower-impedance layer(s) 601, the higher-impedance layer(s) 603 and the lower-impedance layer(s) 605 may be as described above with reference to FIG. 6 (or as described elsewhere herein). However, in category of implementations, the lower-impedance layer(s) 601 and/or the lower-impedance layer(s) 605 include a plurality of layers, including at least a first layer and a second layer, the first layer having a first acoustic impedance that is higher than a second acoustic impedance of the second layer.

In this example, the acoustic impedance of the higher-impedance layer(s) 603 is much higher than the acoustic impedance of each of the lower-impedance layer(s) 601 and the lower-impedance layer(s) 605. In some examples, the higher-impedance layer(s) 603 may be, or may include, one or more glass layers or metal layers (e.g., aluminum, copper or stainless steel). In some such examples, the low-impedance layers 203 may include plastic layers (e.g., having acoustic impedances in the range of 1.7 to 4.2 MRayls).

According to this specific example, the lower-impedance layer(s) 601 and the lower-impedance layer(s) 605 include alternating layers of a first material (Material 1) and a second material (Material 2). Here, Material 1 has a different acoustic impedance from that of Material 2. In some examples, Material 1 has a lower acoustic impedance than that of Material 2. In one such example, Material 1 may be, or may include, an optically clear adhesive (OCA) and Material 2 may be, or may include, polyethylene terephthalate (PET). However, Material 1 and Material 2 may be other materials, depending on the particular implementation.

In this implementation, the higher-impedance layer(s) 603 has or have a thickness corresponding to a multiple of a half wavelength of a peak frequency of the acoustic resonator 103. According to this example, the Material 1 and Material 2 layers of the lower-impedance layer(s) 601 and the lower-impedance layer(s) 605 each have a thickness corresponding to a multiple of a quarter wavelength of a peak frequency of the acoustic resonator 103. The peak frequency may be within a frequency range from 1 MHz. to 20 MHz.

Figure 8:
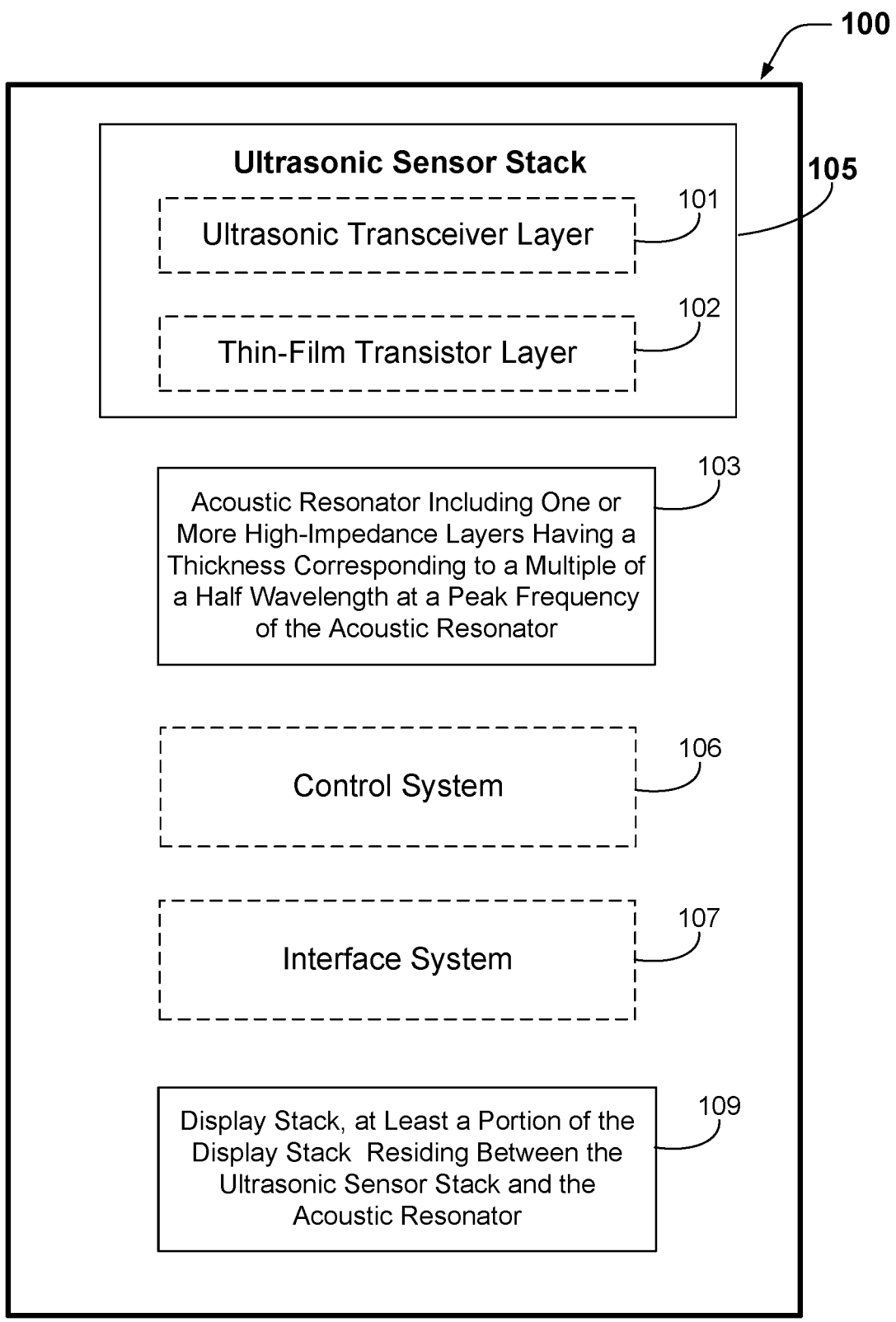
FIG. 8 is another block diagram that shows example components of an apparatus according to some disclosed implementations.

FIG. 8 is another block diagram that shows example components of an apparatus according to some disclosed implementations. As with other disclosed implementations, the numbers, types and arrangements of elements shown in FIG. 8 are merely presented by way of example. Although not shown in FIG. 8, the apparatus 100 may include other components, such as a cover (which may be, or may include, a cover glass), one or more adhesive layers, one or more electrode layers, etc. Some examples are described below. The blocks of FIG. 8 represent another class of implementations of FIG. 1. This class of implementations includes at least the ultrasonic sensor stack 105, the acoustic resonator 103 and the display stack 109. Accordingly, the ultrasonic sensor stack 105, the optional control system 106, the optional interface system 107 and the optional display stack 109 may as described above with reference to FIG. 1 (or as described elsewhere herein). In some implementations, the apparatus 100 may be a mobile device that includes the elements shown in FIG. 8, or at least the ultrasonic sensor stack 105, the acoustic resonator 103 and the display stack 109.

According to this example, the apparatus 100 includes an acoustic resonator 103. The acoustic resonator 103 may be configured to enhance ultrasonic waves transmitted by the ultrasonic sensor stack in an ultrasonic frequency range that is suitable for ultrasonic fingerprint sensors. In this example, the acoustic resonator 103 includes one or more high-impedance layers having a thickness corresponding to a multiple of a half wavelength at a peak frequency of the acoustic resonator. In some examples, one or more of the higher-impedance layer(s) may be, or may include, glass. In this example, at least a portion of the display stack 109 resides between the ultrasonic sensor stack 105 and the acoustic resonator 103. In some instances, the display stack 109 may be, or may include, an organic light-emitting diode display stack. However, in some implementations one or more of the higher-impedance layer(s) may be, or may include, metal.

Figure 9:
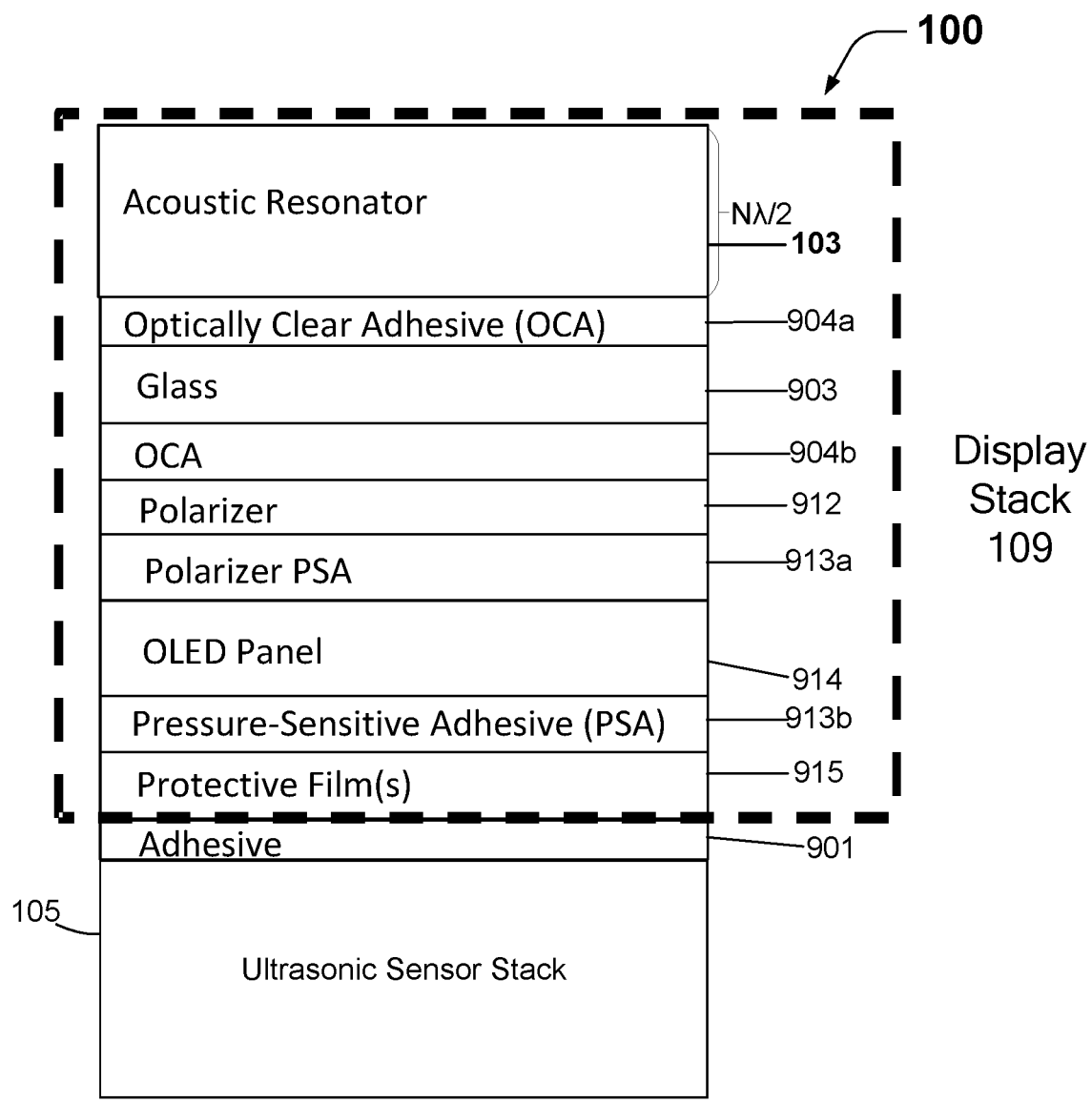
FIG. 9 shows examples of a display stack and an ultrasonic sensor stack according to some implementations.

FIG. 9 shows examples of a display stack and an ultrasonic sensor stack according to some implementations. As with other disclosed implementations, the types, number and arrangement of elements shown in FIG. 9 are merely examples. Other implementations may include different types, numbers and/or arrangements of elements. Here, the apparatus 100 is an instance of the apparatus 100 that is shown in FIGS. 1 and 8. According to this example, the apparatus 100 includes an ultrasonic sensor stack 105 and an instance of the display stack 109 of FIGS. 1 and 8. In this example, the ultrasonic sensor stack 105 is attached to the display stack 109 via an adhesive layer 901.

In this example, the display stack 109 includes an acoustic resonator 103, a glass layer 903, a polarizer layer 912, an OLED panel 914 and one or more layers of protective film 915. According to this implementation, an optically clear adhesive (OCA) layer 904a connects the acoustic resonator 103 to the glass layer 903 and an OCA layer 904b connects the glass layer 903 to the polarizer layer 912. In this implementation, a polarizer pressure-sensitive adhesive 913a connects the polarizer 912 to the OLED panel 914 and a pressure-sensitive adhesive 913b connects the OLED panel 914 to the one or more layers of protective film 915. The polarizer pressure-sensitive adhesive 913a may, for example, be an optically clear adhesive (OCA).

According to this example, the acoustic resonator 103 includes one or more high-impedance layers having a thickness corresponding to a multiple of a half wavelength at a peak frequency of the acoustic resonator 103. In this implementation, the acoustic resonator 103 includes one or more protective layers that may be, or may include, a cover glass. In some instances, the acoustic resonator 103 may include the OCA 904a and the glass layer 903. According to some examples, the acoustic resonator 103 may have a thickness that is in the range of 500 microns to 700 microns.

Figure 10:
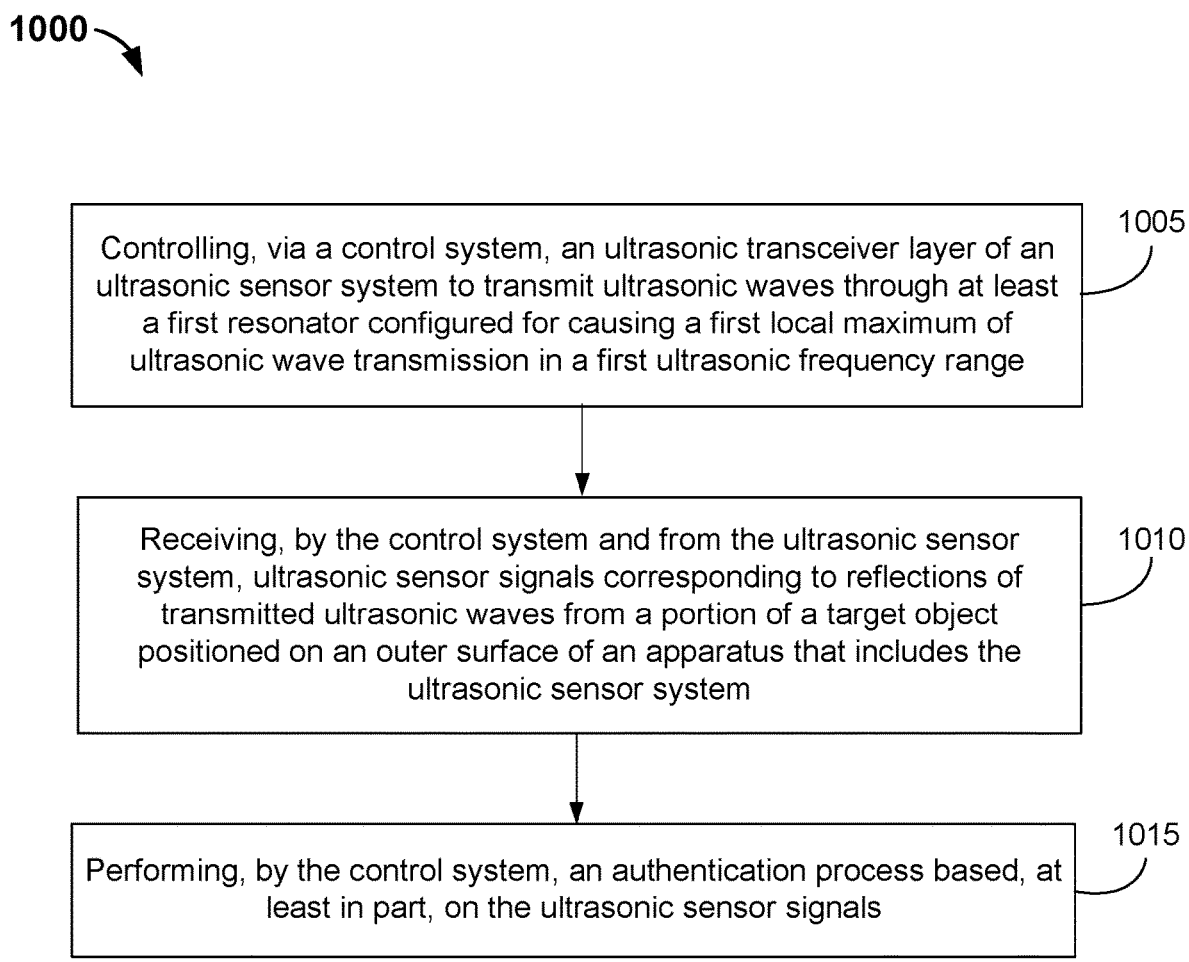
FIG. 10 is a flow diagram that provides examples of operations according to some disclosed methods.

FIG. 10 is a flow diagram that provides examples of operations according to some disclosed methods. The blocks of FIG. 10 may, for example, be performed by the apparatus 100 of FIG. 1 (e.g., by the control system 106 and the ultrasonic sensor stack 105), or by a similar apparatus that includes the ultrasonic sensor stack 105 and at least one acoustic resonator 103. As with other methods disclosed herein, the method outlined in FIG. 10 may include more or fewer blocks than indicated. Moreover, the blocks of methods disclosed herein are not necessarily performed in the order indicated. In some instances, one or more blocks may be performed concurrently.

In this example, block 1005 involves controlling, via a control system (e.g., via the control system 106) an ultrasonic transceiver layer of an ultrasonic sensor system (e.g., the ultrasonic transceiver layer 101) to transmit ultrasonic waves (e.g., the ultrasonic waves 713 shown in FIG. 7) through at least a first resonator configured for causing a first local maximum of ultrasonic wave transmission in a first ultrasonic frequency range. According to this example, the first resonator corresponds to any one of the implementations of the acoustic resonator 103 that are disclosed herein.

In some instances, the first ultrasonic frequency range may be the range from 5 MHz to 15 MHz. In some examples, the first ultrasonic frequency range may be the range from 1 MHz to 20 MHz.

According to this implementation, block 1010 involves receiving, by the control system and from the ultrasonic sensor system, ultrasonic sensor signals corresponding to reflections of transmitted ultrasonic waves from a portion of a target object positioned on an outer surface of an apparatus that includes the ultrasonic sensor system. According to some examples, the ultrasonic sensor signals may correspond to reflections from an interior of the portion of the target object. If the target object is a finger, the ultrasonic sensor signals may correspond to reflections of the first ultrasonic wave(s) from a subsurface of the finger, e.g., of reflections from one or more sub-epidermal features. Alternatively, or additionally, the ultrasonic sensor signals may correspond to reflections of the transmitted ultrasonic waves from a surface of the portion of the target object. If the target object is a finger, the ultrasonic sensor signals may correspond to reflections of the second ultrasonic wave(s) from a surface of the finger, e.g., from ridges and valleys of a fingerprint.

According to this implementation, block 1015 involves performing, by the control system, an authentication process that is based, at least in part, on the ultrasonic sensor signals. In some implementations, method 1000 may involve controlling access to the apparatus, or to another device, based at least in part on the authentication process.

According to some implementations, block 1015 may involve obtaining fingerprint data based on portions of the ultrasonic sensor signals received within a time interval corresponding with fingerprints. The time interval may, for example, be measured relative to a time at which the ultrasonic waves were transmitted. Obtaining the fingerprint data may, for example, involve extracting target object features from the ultrasonic sensor signals. The target object features may, for example, comprise fingerprint features. According to some examples, the fingerprint features may include fingerprint minutiae, keypoints and/or sweat pores. In some examples, the fingerprint features may include ridge ending information, ridge bifurcation information, short ridge information, ridge flow information, island information, spur information, delta information, core information, etc.

In some examples, block 1015 may involve comparing the fingerprint features with fingerprint features of an authorized user. The fingerprint features of the authorized user may, for example, have been received during a previous enrollment process.

In some implementations, block 1015 may involve extracting sub-epidermal features from the ultrasonic sensor signals. Sub-epidermal features of the authorized user may, for example, have been received during a previous enrollment process. According to some implementations, the authentication process may involve comparing sub-epidermal features extracted from the ultrasonic sensor signals with sub-epidermal features of the authorized user.

In some such implementations, the sub-epidermal features may include sub-epidermal layer information corresponding to reflections of the ultrasonic waves received from the portion of the target object within a time interval corresponding with a sub-epidermal region. The sub-epidermal features may, for example, include dermis layer information corresponding to reflections of the second ultrasonic wave received from the portion of the target object. The dermis layer information may have been obtained within a time interval corresponding with a dermis layer. The authentication process may be based, at least in part, on the dermis layer information. Alternatively, or additionally, the sub-epidermal features may include information regarding other sub-epidermal layers, such as the papillary layer, the reticular layer, the subcutis, etc., any blood vessels, lymph vessels, sweat glands, hair follicles, hair papilla, fat lobules, etc., that may be present within such tissue layers, muscle tissue, bone material, etc.

Figure 11:
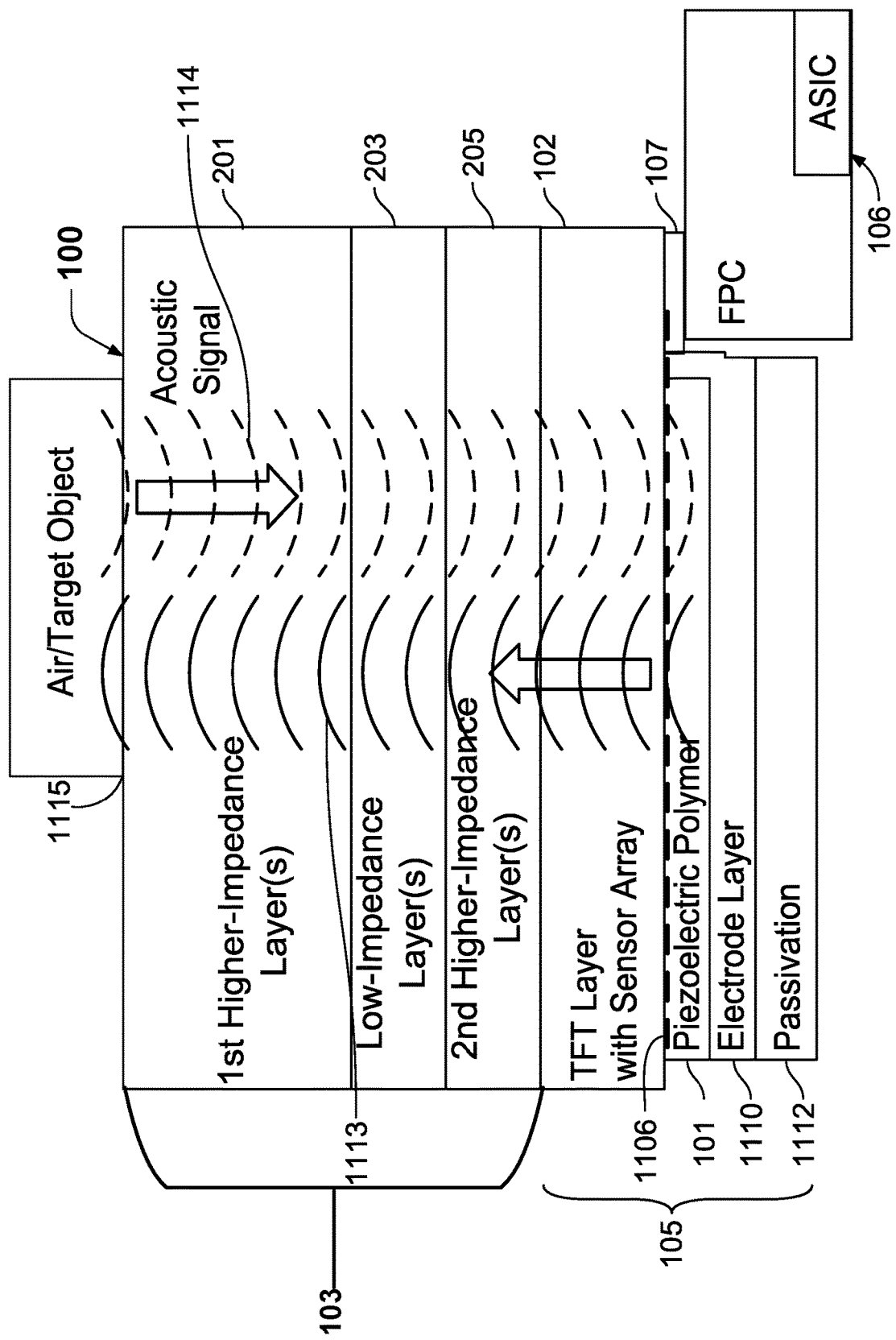
FIG. 11 shows example components of an apparatus according to some disclosed implementations.

FIG. 11 shows example components of an apparatus according to some disclosed implementations. As with other disclosed implementations, the types, number and arrangement of elements, as well as the dimensions of elements, are merely examples. According to this example, the apparatus 100 is configured to perform at least some of the methods disclosed herein. According to this implementation, the ultrasonic sensor stack 105 includes a ultrasonic transceiver layer 101, an electrode layer 1110 on one side of the ultrasonic transceiver layer 101 and an array of sensor pixels 1106 on a second and opposing side of the ultrasonic transceiver layer 101. In this implementation, the ultrasonic transceiver layer 101 includes one or more piezoelectric polymers. In other implementations, the ultrasonic transceiver layer 101 may include other types of piezoelectric materials.

According to this example, the electrode layer 1110 resides between a passivation layer 1112 and the ultrasonic transceiver layer 101. In some examples, the passivation layer 1112 may include an adhesive, such as an epoxy film, a polymer layer (such as a polyethylene terephthalate (PET) layer), etc.

In this example the TFT layer 102 includes a TFT substrate and circuitry for the array of sensor pixels 1106. The TFT layer 102 may be a type of metal-oxide-semiconductor field-effect transistor (MOSFET) made by depositing thin films of an active semiconductor layer as well as a dielectric layer and metallic contacts over a TFT substrate. In some examples, the TFT substrate may be a non-conductive material such as glass.

In this example, the apparatus 100 includes an acoustic resonator 103. According to this example, the acoustic resonator 103 is one of the types that are described above with reference to FIGS. 1, 2 and 3A: here, the acoustic resonator 103 includes the first higher-impedance layer(s) 201, the one or more low-impedance layers 203 and the second higher-impedance layer(s) 205, which may be as described above with reference to FIGS. 2 and 3A (or as described elsewhere herein). According to this example, the one or more low-impedance layers 203 have a thickness corresponding to a multiple of a half wavelength of a peak frequency of the acoustic resonator 103. However, in other implementations the acoustic resonator 103 may have a different configuration, such as one of the other examples of the acoustic resonator 103 that are disclosed herein.

According to this implementation, the TFT layer 102, the array of sensor pixels 1106 and the electrode are electrically coupled to at least a portion of the control system 106 and one side of the ultrasonic transceiver layer 101 via a portion of the interface system 107, which includes electrically conducting material and a flexible printed circuit (FPC) in this instance.

In this example, the apparatus 100 is configured to perform at least some of the methods disclosed herein. In this example, the control system 106 is configured to control the ultrasonic sensor system to transmit one or more ultrasonic waves 1113. According to this example, the ultrasonic waves 1113 are transmitted through the TFT layer 102 and the layer(s) of the acoustic resonator 103. According to this example, reflections 1114 of the ultrasonic waves 1113 are caused by acoustic impedance contrast at (or near) the interface 1115 between the outer surface of the cover 1118 and whatever is in contact with the outer surface, which may be air or the surface of a target object, such as the ridges and valleys of a fingerprint, etc. (As used herein, the term "finger" may refer to any digit, including a thumb. Accordingly, a thumbprint will be considered a type of "fingerprint.")

According to some examples, reflections 1114 of the ultrasonic wave(s) 1113 may be detected by the array of sensor pixels 1106. Corresponding ultrasonic signals may be provided to the control system 106. In some such implementations, ultrasonic signals that are used by the control system 106 for fingerprint-based authentication may be based on reflections 1114 from a cover/finger interface that are detected by the array of sensor pixels 1106. In some implementations, reflections 1114 corresponding to a cover/air interface may be detected by the electrode layer 1110 and corresponding background ultrasonic signals may be provided to the control system 106.

Figure 12:
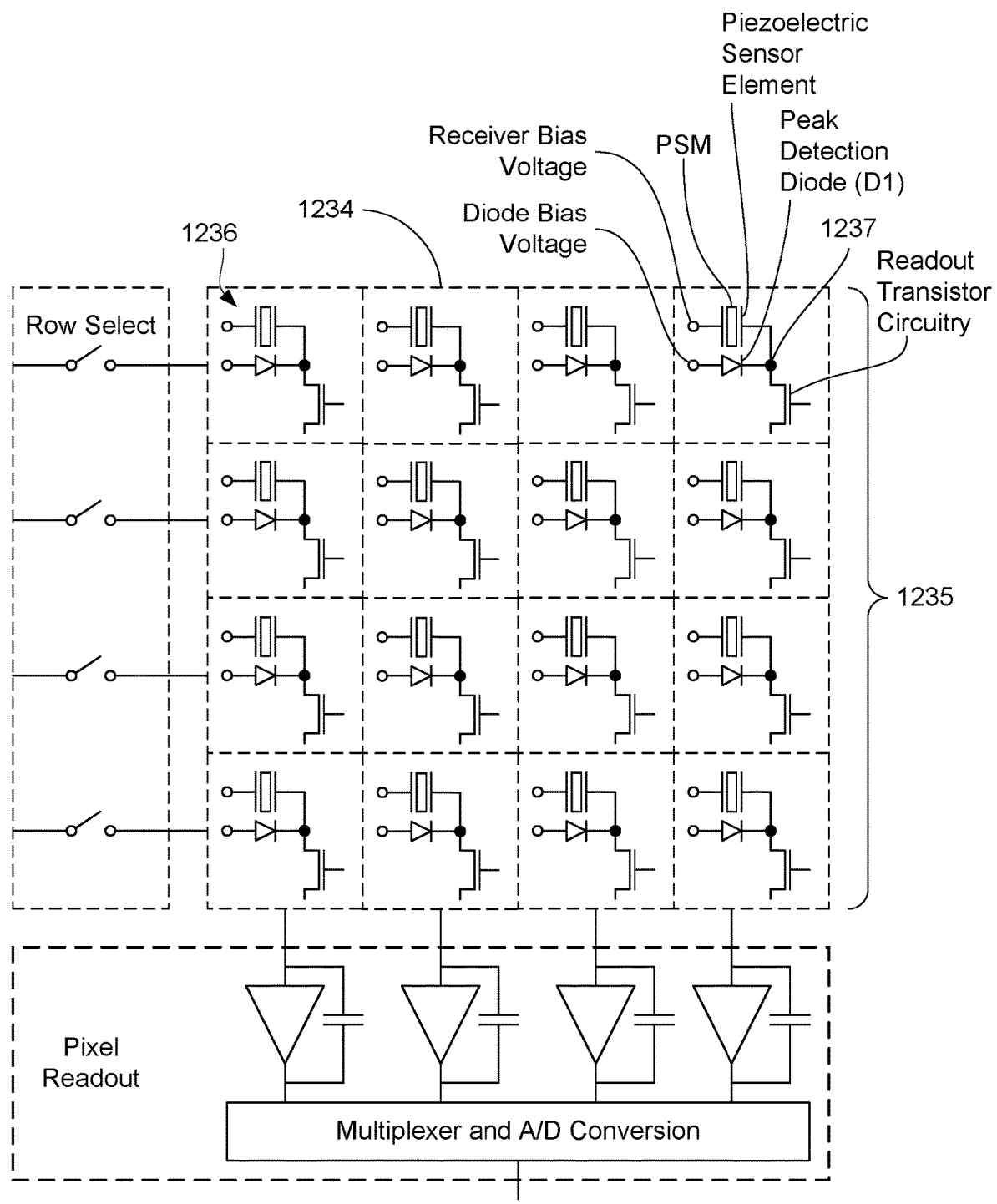
FIG. 12 representationally depicts aspects of a 4×4 pixel array of sensor pixels for an ultrasonic sensor system.

FIG. 12 representationally depicts aspects of a 4×4 pixel array of sensor pixels for an ultrasonic sensor system. Each pixel 1234 may be, for example, associated with a local region of piezoelectric sensor material (PSM), a pixel input electrode 1237, a peak detection diode (D1) and a readout transistor (M3); many or all of these elements may be formed on or in a substrate to form the pixel circuit 1236. In practice, the local region of piezoelectric sensor material of each pixel 1234 may transduce received ultrasonic energy into electrical charges. The peak detection diode D1 may register the maximum amount of charge detected by the local region of piezoelectric sensor material PSM. Each row of the pixel array 1235 may then be scanned, e.g., through a row select mechanism, a gate driver, or a shift register, and the readout transistor M3 for each column may be triggered to allow the magnitude of the peak charge for each pixel 1234 to be read by additional circuitry, e.g., a multiplexer and an A/D converter. The pixel circuit 1236 may include one or more TFTs to allow gating, addressing, and resetting of the pixel 1234.

Each pixel circuit 1236 may provide information about a small portion of the object detected by the ultrasonic sensor system. While, for convenience of illustration, the example shown in FIG. 12 is of a relatively coarse resolution, ultrasonic sensors having a resolution on the order of 500 pixels per inch or higher may be configured with an appropriately scaled structure. The detection area of the ultrasonic sensor system may be selected depending on the intended object of detection. For example, the detection area may range from about 5 mm×5 mm for a single finger to about 3 inches×3 inches for four fingers. Smaller and larger areas, including square, rectangular and non-rectangular geometries, may be used as appropriate for the target object.

Implementation examples are described in the following numbered clauses:

1. An apparatus, comprising: an ultrasonic sensor stack; and an acoustic resonator, comprising: a first higher-impedance layer; a second higher-impedance layer; and one or more low-impedance layers residing between the first higher-impedance layer and the second higher-impedance layer, each of the one or more low-impedance layers having a lower acoustic impedance than an acoustic impedance of the first higher-impedance layer or an acoustic impedance of the second higher-impedance layer, at least one of the one or more low-impedance layers having a thickness corresponding to a multiple of a half wavelength at a peak frequency of the acoustic resonator.

2. The apparatus of clause 1, wherein at least one of the first higher-impedance layer or the second higher-impedance layer has a thickness corresponding to a multiple of a quarter wavelength at the peak frequency of the acoustic resonator.

3. The apparatus of clause 1, wherein at least one of the first higher-impedance layer or the second higher-impedance layer has a thickness corresponding to less than one-eighth of a wavelength at the peak frequency of the acoustic resonator.

4. The apparatus of clause 1, wherein the ultrasonic sensor stack resides between the first higher-impedance layer and the second higher-impedance layer.

5. The apparatus of clause 4, wherein the one or more low-impedance layers comprise: a first low-impedance layer residing between the ultrasonic sensor stack and the first higher-impedance layer; and a second low-impedance layer residing between the ultrasonic sensor stack and the second higher-impedance layer, the first low-impedance layer and the second low-impedance layer each having a thickness corresponding to a multiple of a half wavelength at the peak frequency.

6. The apparatus of clause 5, wherein the one or more low-impedance layers further comprise: a third low-impedance layer residing between the first low-impedance layer and the first higher-impedance layer; a fourth low-impedance layer residing between the first low-impedance layer and the ultrasonic sensor stack; a fifth low-impedance layer residing between the second low-impedance layer and the ultrasonic sensor stack; and a sixth low-impedance layer residing between the second low-impedance layer and the second higher-impedance layer, wherein the third low-impedance layer, the fourth low-impedance layer the fifth low-impedance layer and the sixth low-impedance layer each have a thickness corresponding to a multiple of the half wavelength at the peak frequency.

7. The apparatus of clause 6, wherein the third low-impedance layer, the fourth low-impedance layer, the fifth low-impedance layer and the sixth low-impedance layer each have a lower acoustic impedance than the acoustic impedance of the first low-impedance layer or the acoustic impedance of the second low-impedance layer.

8. The apparatus of clause 1, wherein the one or more low-impedance layers comprise: a first low-impedance layer; a second low-impedance layer residing between the first low-impedance layer and the first higher-impedance layer; and a third low-impedance layer residing between the first low-impedance layer and the second higher-impedance layer, wherein the second low-impedance layer and the third low-impedance layer each have an acoustic impedance that is lower than an acoustic impedance of the first low-impedance layer.

9. The apparatus of clause 8, wherein the first low-impedance layer, the second low-impedance layer and the third low-impedance layer each have a thickness corresponding to a multiple of the half wavelength at the peak frequency.

10. The apparatus of clause 8, wherein the first low-impedance layer has a thickness corresponding to a multiple of the half wavelength at the peak frequency and wherein the second low-impedance layer and the third low-impedance layer each have a thickness corresponding to a multiple of a quarter wavelength at the peak frequency.

11. The apparatus of clause 1, wherein at least one of the first higher-impedance layer or the second higher-impedance layer comprises glass.

12. The apparatus of clause 1, wherein at least one of the first higher-impedance layer or the second higher-impedance layer comprises metal.

13. The apparatus of clause 1, wherein at least one of the first higher-impedance layer or the second higher-impedance layer comprises a plurality of layers having a thickness corresponding to a multiple of a quarter wavelength at the peak frequency of the acoustic resonator.

14. The apparatus of clause 13, wherein the plurality of layers includes at least a first layer and a second layer, the first layer having a first acoustic impedance that is higher than a second acoustic impedance of the second layer.

15. The apparatus of clause 1, further comprising a display stack.

16. The apparatus of clause 1, wherein the apparatus is a mobile device that includes the ultrasonic sensor stack and the acoustic resonator.

17. A method, comprising: controlling, via a control system, an ultrasonic transceiver layer of an ultrasonic sensor system to transmit ultrasonic waves through at least a first resonator configured for causing a first local maximum of ultrasonic wave transmission in a first ultrasonic frequency range; receiving, by the control system and from the ultrasonic sensor system, ultrasonic sensor signals corresponding to reflections of transmitted ultrasonic waves from a portion of a target object positioned on an outer surface of an apparatus that includes the ultrasonic sensor system; and performing, by the control system, an authentication process based, at least in part, on the ultrasonic sensor signals.

18. The method of clause 17, wherein the first local maximum of ultrasonic wave transmission corresponds to a frequency in a range from 1 MHz to 20 MHz.

19. The method of clause 17, wherein the authentication process involves extracting target object features from the ultrasonic sensor signals.

20. The method of clause 19, wherein the target object features include at least one of fingerprint features or sub-epidermal features.

21. The method of clause 17, further comprising controlling access to the apparatus based, at least in part, on the authentication process.

22. An apparatus, comprising: ultrasonic sensor means; and an acoustic resonator, comprising: a first higher-impedance layer; a second higher-impedance layer; and one or more low-impedance layers residing between the first higher-impedance layer and the second higher-impedance layer, each of the one or more low-impedance layers having a lower acoustic impedance than an acoustic impedance of the first higher-impedance layer or an acoustic impedance of the second higher-impedance layer, at least one of the one or more low-impedance layers having a thickness corresponding to a multiple of a half wavelength at a peak frequency of the acoustic resonator.

23. The apparatus of clause 22, wherein at least one of the first higher-impedance layer or the second higher-impedance layer has a thickness corresponding to a multiple of a quarter wavelength at the peak frequency of the acoustic resonator.

24. The apparatus of clause 22, wherein at least one of the first higher-impedance layer or the second higher-impedance layer has a thickness corresponding to less than one-eighth of a wavelength at the peak frequency of the acoustic resonator.

25. The apparatus of clause 22, wherein the ultrasonic sensor means resides between the first higher-impedance layer and the second higher-impedance layer.

26. The apparatus of clause 25, wherein the one or more low-impedance layers comprise: a first low-impedance layer residing between the ultrasonic sensor means and the first higher-impedance layer; and a second low-impedance layer residing between the ultrasonic sensor means and the second higher-impedance layer, the first low-impedance layer and the second low-impedance layer each having a thickness corresponding to a multiple of a half wavelength at the peak frequency.

27. An apparatus, comprising: an ultrasonic sensor stack; and an acoustic resonator, comprising: one or more higher-impedance layers having a thickness corresponding to a multiple of a half wavelength at a peak frequency of the acoustic resonator; one or more first low-impedance layers residing between a first side of one or more higher-impedance layers and the ultrasonic sensor stack, each layer of the one or more first low-impedance layers having a lower acoustic impedance than an acoustic impedance of one or more higher-impedance layers, each layer of the one or more first low-impedance layers having a thickness corresponding to a multiple of a quarter wavelength at the peak frequency of the acoustic resonator; and one or more second low-impedance layers residing proximate a second side of one or more higher-impedance layers, each layer of the one or more second low-impedance layers having a lower acoustic impedance than the acoustic impedance of one or more higher-impedance layers, each layer of the one or more second low-impedance layers having a thickness corresponding to a multiple of the quarter wavelength at the peak frequency of the acoustic resonator.

28. The apparatus of clause 27, wherein one or more of the one or more higher-impedance layers comprise glass.

29. The apparatus of clause 27, wherein one or more of the one or more higher-impedance layers comprise metal.

30. The apparatus of clause 27, wherein at least one of the one or more first low-impedance layers or the one or more second low-impedance layers comprises a plurality of layers and wherein the plurality of layers includes at least a first layer and a second layer, the first layer having a first acoustic impedance that is higher than a second acoustic impedance of the second layer.

31. The apparatus of clause 27, further comprising a display stack.

32. The apparatus of clause 31, wherein the one or more second low-impedance layers resides between the display stack and the one or more higher-impedance layers.

33. The apparatus of clause 27, wherein the apparatus is a mobile device that includes the ultrasonic sensor stack and the acoustic resonator.

34. An apparatus, comprising: ultrasonic sensor means; and an acoustic resonator, comprising: one or more higher-impedance layers having a thickness corresponding to a multiple of a half wavelength at a peak frequency of the acoustic resonator; one or more first low-impedance layers residing between a first side of one or more higher-impedance layers and the ultrasonic sensor means, each layer of the one or more first low-impedance layers having a lower acoustic impedance than an acoustic impedance of one or more higher-impedance layers, each layer of the one or more first low-impedance layers having a thickness corresponding to a multiple of a quarter wavelength at the peak frequency of the acoustic resonator; and one or more second low-impedance layers residing proximate a second side of one or more higher-impedance layers, each layer of the one or more second low-impedance layers having a lower acoustic impedance than the acoustic impedance of one or more higher-impedance layers, each layer of the one or more second low-impedance layers having a thickness corresponding to a multiple of the quarter wavelength at the peak frequency of the acoustic resonator.

35. The apparatus of clause 34, wherein one or more of the one or more higher-impedance layers comprise glass.

36. The apparatus of clause 34, wherein one or more of the one or more higher-impedance layers comprise metal.

37. The apparatus of clause 34, wherein at least one of the one or more first low-impedance layers or the one or more second low-impedance layers comprises a plurality of layers and wherein the plurality of layers includes at least a first layer and a second layer, the first layer having a first acoustic impedance that is higher than a second acoustic impedance of the second layer.

38. The apparatus of clause 34, further comprising a display stack.

39. The apparatus of clause 38, wherein the one or more second low-impedance layers resides between the display stack and the one or more higher-impedance layers.

40. The apparatus of clause 34, wherein the apparatus is a mobile device that includes the ultrasonic sensor means and the acoustic resonator.

41. A method, comprising: controlling, via a control system, an ultrasonic sensor stack to transmit ultrasonic waves through an acoustic resonator to a target object on an outer surface of an apparatus that includes the ultrasonic sensor stack and the acoustic resonator; receiving, by the control system and from the ultrasonic sensor stack, ultrasonic sensor signals corresponding to reflections of transmitted ultrasonic waves from the target object; and performing an authentication process based, at least in part, on the ultrasonic sensor signals, wherein the acoustic resonator comprises: one or more higher-impedance layers having a thickness corresponding to a multiple of a half wavelength at a peak frequency of the acoustic resonator; one or more first low-impedance layers residing between a first side of one or more higher-impedance layers and the ultrasonic sensor means, each layer of the one or more first low-impedance layers having a lower acoustic impedance than an acoustic impedance of one or more higher-impedance layers, each layer of the one or more first low-impedance layers having a thickness corresponding to a multiple of a quarter wavelength at the peak frequency of the acoustic resonator; and one or more second low-impedance layers residing proximate a second side of one or more higher-impedance layers, each layer of the one or more second low-impedance layers having a lower acoustic impedance than the acoustic impedance of one or more higher-impedance layers, each layer of the one or more second low-impedance layers having a thickness corresponding to a multiple of the quarter wavelength at the peak frequency of the acoustic resonator.

42. The method of clause 41, wherein one or more of the one or more higher-impedance layers comprise glass.

43. The method of clause 41, wherein one or more of the one or more higher-impedance layers comprise metal.

44. The method of clause 41, wherein at least one of the one or more first low-impedance layers or the one or more second low-impedance layers comprises a plurality of layers and wherein the plurality of layers includes at least a first layer and a second layer, the first layer having a first acoustic impedance that is higher than a second acoustic impedance of the second layer.

45. The method of clause 41, wherein the apparatus further comprises a display stack and wherein the one or more second low-impedance layers resides between the display stack and the one or more higher-impedance layers.

46. The method of clause 41, wherein the apparatus is a mobile device that includes the ultrasonic sensor means and the acoustic resonator.

47. An apparatus, comprising: an ultrasonic sensor stack; an acoustic resonator, including one or more high-impedance layers having a thickness corresponding to a multiple of a half wavelength at a peak frequency of the acoustic resonator; and a display stack residing between the ultrasonic sensor stack and the acoustic resonator.

48. The apparatus of clause 47, wherein one or more of one or more high-impedance layers comprise glass.

49. The apparatus of clause 47, wherein the apparatus is a mobile device that includes the ultrasonic sensor stack, the display stack and the acoustic resonator.

50. The apparatus of clause 47, wherein the display stack comprises an organic light-emitting diode display stack.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those having ordinary skill in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein, if at all, to mean "serving as an example, instance, or illustration." Any implementation described herein as "exemplary" is not necessarily to be construed as preferred or advantageous over other implementations.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

The invention claimed is:

1. An apparatus, comprising:
an ultrasonic sensor stack; and
an acoustic resonator, comprising:
one or more higher-impedance layers having a thickness corresponding to a multiple of a half wavelength at a peak frequency of the acoustic resonator;
one or more first low-impedance layers residing between a first side of the one or more higher-impedance layers and the ultrasonic sensor stack, each layer of the one or more first low-impedance layers having a lower acoustic impedance than an acoustic impedance of the one or more higher-impedance layers, each layer of the one or more first low-impedance layers having a thickness corresponding to a multiple of a quarter wavelength at the peak frequency of the acoustic resonator; and
one or more second low-impedance layers residing proximate a second side of the one or more higher-impedance layers, each layer of the one or more second low-impedance layers having a lower acoustic impedance than the acoustic impedance of one or more higher-impedance layers, each layer of the one or more second low-impedance layers having a thickness corresponding to the multiple of the quarter wavelength at the peak frequency of the acoustic resonator.

2. The apparatus of claim 1, wherein one or more of the one or more higher-impedance layers comprise glass.

3. The apparatus of claim 1, wherein one or more of the one or more higher-impedance layers comprise metal.

4. The apparatus of claim 1, wherein at least one of the one or more first low-impedance layers or the one or more second low-impedance layers comprises a plurality of layers and wherein the plurality of layers includes at least a first layer and a second layer, the first layer having a first acoustic impedance that is higher than a second acoustic impedance of the second layer.

5. The apparatus of claim 1, further comprising a display stack.

6. The apparatus of claim 5, wherein the one or more second low-impedance layers resides between the display stack and the one or more higher-impedance layers.

7. The apparatus of claim 1, wherein the apparatus is a mobile device that includes the ultrasonic sensor stack and the acoustic resonator.

8. An apparatus, comprising:
ultrasonic sensor means; and
an acoustic resonator, comprising:
   one or more higher-impedance layers having a thickness corresponding to a multiple of a half wavelength at a peak frequency of the acoustic resonator;
   one or more first low-impedance layers residing between a first side of the one or more higher-impedance layers and the ultrasonic sensor means, each layer of the one or more first low-impedance layers having a lower acoustic impedance than an acoustic impedance of the one or more higher-impedance layers, each layer of the one or more first low-impedance layers having a thickness corresponding to a multiple of a quarter wavelength at the peak frequency of the acoustic resonator; and
   one or more second low-impedance layers residing proximate a second side of the one or more higher-impedance layers, each layer of the one or more second low-impedance layers having a lower acoustic impedance than the acoustic impedance of the one or more higher-impedance layers, each layer of the one or more second low-impedance layers having a thickness corresponding to the multiple of the quarter wavelength at the peak frequency of the acoustic resonator.

9. The apparatus of claim 8, wherein one or more of the one or more higher-impedance layers comprise glass.

10. The apparatus of claim 8, wherein one or more of the one or more higher-impedance layers comprise metal.

11. The apparatus of claim 8, wherein at least one of the one or more first low-impedance layers or the one or more second low-impedance layers comprises a plurality of layers and wherein the plurality of layers includes at least a first layer and a second layer, the first layer having a first acoustic impedance that is higher than a second acoustic impedance of the second layer.

12. The apparatus of claim 8, further comprising a display stack.

13. The apparatus of claim 12, wherein the one or more second low-impedance layers resides between the display stack and the one or more higher-impedance layers.

14. The apparatus of claim 8, wherein the apparatus is a mobile device that includes the ultrasonic sensor means and the acoustic resonator.

15. A method, comprising:
controlling, via a control system, an ultrasonic sensor stack to transmit ultrasonic waves through an acoustic resonator to a target object on an outer surface of an apparatus that includes the ultrasonic sensor stack and the acoustic resonator;
receiving, by the control system and from the ultrasonic sensor stack, ultrasonic sensor signals corresponding to reflections of transmitted ultrasonic waves from the target object; and
performing an authentication process based, at least in part, on the ultrasonic sensor signals, wherein the acoustic resonator comprises:
   one or more higher-impedance layers having a thickness corresponding to a multiple of a half wavelength at a peak frequency of the acoustic resonator;
   one or more first low-impedance layers residing between a first side of the one or more higher-impedance layers and the ultrasonic sensor stack, each layer of the one or more first low-impedance layers having a lower acoustic impedance than an acoustic impedance of the one or more higher-impedance layers, each layer of the one or more first low-impedance layers having a thickness corresponding to a multiple of a quarter wavelength at the peak frequency of the acoustic resonator; and
   one or more second low-impedance layers residing proximate a second side of the one or more higher-impedance layers, each layer of the one or more second low-impedance layers having a lower acoustic impedance than the acoustic impedance of the one or more higher-impedance layers, each layer of the one or more second low-impedance layers having a thickness corresponding to the multiple of the quarter wavelength at the peak frequency of the acoustic resonator.

16. The method of claim 15, wherein one or more of the one or more higher-impedance layers comprise glass.

17. The method of claim 15, wherein one or more of the one or more higher-impedance layers comprise metal.

18. The method of claim 15, wherein at least one of the one or more first low-impedance layers or the one or more second low-impedance layers comprises a plurality of layers and wherein the plurality of layers includes at least a first layer and a second layer, the first layer having a first acoustic impedance that is higher than a second acoustic impedance of the second layer.

19. The method of claim 15, wherein the apparatus further comprises a display stack and wherein the one or more second low-impedance layers resides between the display stack and the one or more higher-impedance layers.

20. The method of claim 15, wherein the apparatus is a mobile device that includes the ultrasonic sensor stack and the acoustic resonator.

21. An apparatus, comprising:
an ultrasonic sensor stack;
an acoustic resonator, including one or more high-impedance layers having a thickness corresponding to a multiple of a half wavelength at a peak frequency of the acoustic resonator; and
a display stack residing between the ultrasonic sensor stack and the acoustic resonator.

22. The apparatus of claim 21, wherein one or more of the one or more high-impedance layers comprise glass.

23. The apparatus of claim 21, wherein the apparatus is a mobile device that includes the ultrasonic sensor stack, the display stack and the acoustic resonator.

24. The apparatus of claim 21, wherein the display stack comprises an organic light-emitting diode display stack.

* * * * *